(12) United States Patent
Lee et al.

(10) Patent No.: US 9,761,314 B2
(45) Date of Patent: Sep. 12, 2017

(54) NON-VOLATILE MEMORY DEVICES AND METHODS OF OPERATING THE SAME

(71) Applicant: Samsung Electronics Co., Ltd., Suwon-si (KR)

(72) Inventors: Chang-Hyun Lee, Suwon-si (KR); Jung-Dal Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 14/093,717

(22) Filed: Dec. 2, 2013

(65) Prior Publication Data

US 2014/0160854 A1    Jun. 12, 2014

Related U.S. Application Data

(63) Continuation of application No. 11/402,389, filed on Apr. 12, 2006, now abandoned, which is a
(Continued)

(30) Foreign Application Priority Data

Jun. 28, 2001 (KR) .............. 10-2001-37421
Jan. 31, 2002 (KR) .............. 10-2002-05622
(Continued)

(51) Int. Cl.
*H01L 29/51* (2006.01)
*H01L 29/792* (2006.01)
(Continued)

(52) U.S. Cl.
CPC .............. *G11C 16/12* (2013.01); *G11C 16/14* (2013.01); *G11C 16/26* (2013.01);
(Continued)

(58) Field of Classification Search
CPC ..... H01L 29/51; H01L 29/513; H01L 29/792; G11C 16/12; G11C 16/26
See application file for complete search history.

(56) References Cited

U.S. PATENT DOCUMENTS 4,542,400 A  9/1985 Hiraki et al.
4,630,086 A  12/1986 Sato et al.
(Continued)

FOREIGN PATENT DOCUMENTS

DE    30 32 364 A1    4/1982
DE    30 32 364 C3    4/1982
(Continued)

OTHER PUBLICATIONS

English language translation, Office Action, German Patent Application No. 102 28 768.6-33, Sep. 14, 2009.
(Continued)

*Primary Examiner* — Peniel M Gumedzoe
(74) *Attorney, Agent, or Firm* — Myers Bigel, P.A.

(57) ABSTRACT

A non-volatile memory device includes a semiconductor substrate and a tunnel insulating layer and a gate electrode. A multiple tunnel insulation layer with a plurality of layers, a charge storage insulation layer, and a multiple blocking insulation layer with layers are sequentially stacked between the gate electrode and the tunnel insulating layer. A first diffusion region and a second diffusion region in the semiconductor substrate are adjacent to opposite respective sides of the gate electrode. When a voltage is applied to the gate electrode and the semiconductor substrate to form a voltage level difference therebetween, a minimum field in the tunnel insulation layer is stronger than in the blocking insulation layer. A minimum field at a blocking insulation layer can be stronger than at a tunnel insulation layer, and the migration
(Continued)

probability of charges through the tunnel insulation layer can be higher than through the blocking insulation layer.

17 Claims, 28 Drawing Sheets

Related U.S. Application Data continuation-in-part of application No. 10/795,537, filed on Mar. 8, 2004, now Pat. No. 7,253,467, which is a continuation-in-part of application No. 10/184,328, filed on Jun. 27, 2002, now Pat. No. 6,858,906.

(30) Foreign Application Priority Data

| Apr. 28, 2003 | (KR) | 10-2003-26776 |
|---|---|---|
| Apr. 12, 2005 | (KR) | 10-2005-30456 |
| May 19, 2005 | (KR) | 10-2005-42096 |

(51) Int. Cl.

| G11C 16/14 | (2006.01) |
|---|---|
| G11C 16/26 | (2006.01) |
| G11C 16/12 | (2006.01) |
| H01L 21/28 | (2006.01) |
| H01L 27/115 | (2017.01) |
| H01L 27/11521 | (2017.01) |
| H01L 27/11524 | (2017.01) |
| H01L 27/11526 | (2017.01) |
| H01L 27/11529 | (2017.01) |
| H01L 29/423 | (2006.01) |
| H01L 29/778 | (2006.01) |

(52) U.S. Cl.
CPC ...... *H01L 21/28273* (2013.01); *H01L 27/115* (2013.01); *H01L 27/11521* (2013.01); *H01L 27/11524* (2013.01); *H01L 27/11526* (2013.01); *H01L 27/11529* (2013.01); *H01L 29/42332* (2013.01); *H01L 29/513* (2013.01); *H01L 29/7782* (2013.01); *H01L 29/792* (2013.01); *H01L 29/7923* (2013.01)

(56) References Cited

U.S. PATENT DOCUMENTS

| 4,870,470 A | 9/1989 | Bass et al. |
|---|---|---|
| 5,215,842 A | 6/1993 | Aratani et al. |
| 5,270,298 A | 12/1993 | Ramesh |
| 5,424,567 A | 6/1995 | Chen |
| 5,536,667 A | 7/1996 | Cho |
| 5,583,067 A | 12/1996 | Sanchez |
| 5,619,051 A | 4/1997 | Endo |
| 5,768,192 A | 6/1998 | Eitan |
| 5,923,056 A | 7/1999 | Lee et al. |
| 6,011,725 A | 1/2000 | Eitan |
| 6,141,256 A | 10/2000 | Forbes |
| 6,163,049 A | 12/2000 | Bui |
| 6,166,958 A | 12/2000 | Naruke et al. |
| 6,204,125 B1 | 3/2001 | Lee et al. |
| 6,225,646 B1 | 5/2001 | Gardner et al. |
| 6,236,076 B1 | 5/2001 | Arita et al. |
| 6,287,915 B1 | 9/2001 | Muramatsu |
| 6,294,436 B1 | 9/2001 | Park et al. |
| 6,297,517 B1 | 10/2001 | Matsumoto et al. |
| 6,307,775 B1 | 10/2001 | Forbes et al. |
| 6,417,537 B1 | 7/2002 | Yang et al. |
| 6,458,677 B1 | 10/2002 | Hopper et al. |
| 6,465,828 B2 | 10/2002 | Agarwal |
| 6,489,649 B2 | 12/2002 | Kobayashi et al. |
| 6,512,274 B1 | 1/2003 | King et al. |
| 6,614,069 B2 | 9/2003 | Rösner et al. |
| 6,627,494 B2 | 9/2003 | Joo et al. |
| 6,674,138 B1 | 1/2004 | Halliyal et al. |
| 6,706,599 B1 | 3/2004 | Sadd et al. |
| 6,730,960 B2 | 5/2004 | Forbes |
| 6,768,165 B1 | 7/2004 | Eitan |
| 6,791,883 B2 | 9/2004 | Swift et al. |
| 6,803,272 B1 | 10/2004 | Halliyal et al. |
| 6,818,558 B1 | 11/2004 | Rathor et al. |
| 6,844,604 B2 | 1/2005 | Lee et al. |
| 6,858,899 B2 | 2/2005 | Mahajani et al. |
| 6,885,058 B2 | 4/2005 | Wils et al. |
| 6,906,366 B2 | 6/2005 | Hsu et al. |
| 6,906,390 B2 | 6/2005 | Nomoto et al. |
| 6,924,186 B2 | 8/2005 | Sandhu et al. |
| 6,949,788 B2 | 9/2005 | Fujiwara et al. |
| 6,950,340 B2 | 9/2005 | Bhattacharyya |
| 6,963,103 B2 | 11/2005 | Forbes |
| 7,087,954 B2 | 8/2006 | Forbes |
| 7,109,548 B2 | 9/2006 | Forbes et al. |
| 7,116,577 B2 | 10/2006 | Eitan |
| 7,259,433 B2 | 8/2007 | Nomoto et al. |
| 7,429,767 B2 | 9/2008 | Bhattacharyya |
| 7,629,641 B2 | 12/2009 | Bhattacharyya |
| 7,863,128 B1 * | 1/2011 | Jeon ............ H01L 21/28282 257/E21.179 |
| 2003/0047755 A1 | 3/2003 | Lee et al. |
| 2003/0122204 A1 | 7/2003 | Nomoto et al. |
| 2003/0155605 A1 | 8/2003 | Jong et al. |
| 2003/0183873 A1 | 10/2003 | Fujiwara |
| 2004/0021170 A1 | 2/2004 | Caywood |
| 2005/0023603 A1 | 2/2005 | Eldridge et al. |
| 2005/0189600 A1 | 9/2005 | Ohuchi et al. |
| 2005/0199944 A1 | 9/2005 | Chen et al. |
| 2005/0230766 A1 | 10/2005 | Nomoto et al. |
| 2005/0247970 A1 | 11/2005 | Jeon et al. |
| 2006/0008966 A1 | 1/2006 | Forbes et al. |
| 2006/0022252 A1 * | 2/2006 | Doh ............ H01L 29/792 257/314 |
| 2006/0160303 A1 * | 7/2006 | Ang ............ H01L 21/28282 438/257 |
| 2006/0263981 A1 | 11/2006 | Forbes |
| 2006/0270157 A1 | 11/2006 | Joo |
| 2006/0284246 A1 | 12/2006 | Forbes et al. |

FOREIGN PATENT DOCUMENTS

| JP | 62-033753 A | 2/1987 |
|---|---|---|
| JP | 63-000141 | 1/1988 |
| JP | 02-266570 A | 10/1990 |
| JP | 05-129625 A | 5/1993 |
| JP | 05-251669 A | 9/1993 |
| JP | 07-326681 A | 12/1995 |
| JP | 08-017945 | 1/1996 |
| JP | 08-078551 A | 3/1996 |
| JP | 8-162549 | 6/1996 |
| JP | 9-129757 | 5/1997 |
| JP | 11-008325 | 1/1999 |
| JP | 11-186528 A | 7/1999 |
| JP | 11-297867 A | 10/1999 |
| JP | 2000-349285 A | 12/2000 |
| JP | 2001-35945 | 2/2001 |
| JP | 2001077319 | 3/2001 |
| JP | 2002-203917 | 7/2002 |
| JP | 2002-203917 A | 7/2002 |
| JP | 2002-231834 A | 8/2002 |
| JP | 2003-332467 | 11/2003 |
| JP | 2006-229195 | 8/2006 |
| JP | 2006-339624 | 12/2006 |
| KR | 2001-0066386 | 7/2001 |
| KR | 1020030057851 | 7/2003 |
| KR | 10-2004-0054146 | 6/2004 |
| KR | 10-2004-0106074 | 12/2004 |
| KR | 1020040108309 | 12/2004 |
| KR | 10-2005-0102864 | 10/2005 |
| KR | 10-2006-0011478 | 3/2006 |
| KR | 10-2006-0124001 | 12/2006 |

(56) References Cited

FOREIGN PATENT DOCUMENTS

WO     WO 00/75997     12/2000
WO     WO 02/35610 A1     5/2002

OTHER PUBLICATIONS

Wong et al. Preparation of Thin Dielectric Film for Nonvolatile Memory by Thermal Oxidation of Si-Rich LPCVD Nitride, Journal of the Electrochemical Society, vol. 148, N. 5, pp. G272-G278, 2001.

* cited by examiner

NON-VOLATILE MEMORY DEVICES AND METHODS OF OPERATING THE SAME

RELATED APPLICATIONS

This application is a continuation of U.S. patent application Ser. No. 11/402,389, filed Apr. 12, 2006, which itself is a continuation-in-part of U.S. patent application Ser. No. 10/795,537, filed Mar. 8, 2004, which is a continuation-in-part of U.S. patent application Ser. No. 10/184,328, filed Jun. 27, 2002, and which is related to and claims priority from Korean Patent Application No. 2003-26776, filed on Apr. 28, 2003, from Korean Patent Application No. 2002-05622, filed on Jan. 31, 2002, and from Korean Patent Application No. 2001-37421, filed on Jun. 28, 2001, and this application is related to and claims priority from Korean Patent Application No. P2005-30456, filed Apr. 12, 2005, and from Korean Patent Application No. P2005-42096, filed, May 19, 2005, the contents of each of which are herein incorporated by reference in their entirety.

FIELD OF THE INVENTION

The present invention relates to a non-volatile memory devices.

BACKGROUND OF THE INVENTION

Two types of non-volatile memory devices are floating gate type memory devices and floating trap type memory devices. A floating gate type memory device may include a control gate and a conductive floating gate that is isolated, by an insulating layer, from a substrate channel. Floating gate type memory devices may be programmed by storing charges as free carriers on the conductive floating gate.

Floating trap type memory devices may include a non-conductive charge storage layer between a gate electrode and a substrate. Floating trap type memory devices may be programmed by storing charges in traps in the non-conductive charge storage layer.

Floating gate type memory devices generally have a thicker tunneling insulating layer than floating trap type memory devices to provide comparable reliability for storing charges. A thicker tunneling insulating layer may result in an increased operating voltage for the memory device and an increased complexity of associated peripheral circuitry. Consequently, it may be more difficult to provide high integration density and low power consumption for floating gate type memory devices than for floating trap type memory devices.

A SONOS (silicon-oxide-nitride-oxide-semiconductor) structure of a conventional floating trap type unit memory device is shown in FIG. 1. The memory device includes a tunneling insulating layer 20, a charge storage layer 22, a blocking insulating layer 24, and a gate electrode 27 that are sequentially stacked on an active region of a P-type semiconductor substrate 10. An N$^+$ type impurity diffusion layer 28 is formed at an active region on opposite sides of the gate electrode 27. The tunneling insulating layer 20 may include a thermal oxide material and the charge storage layer 22 may include silicon nitride material.

An energy band diagram of a floating trap type unit memory device is shown in FIG. 2, taken along a line I-I' of FIG. 1. Intrinsic energy band gaps are shown for the materials corresponding to the semiconductor substrate 10, the tunneling insulating layer 20, the charge storage layer 22, the blocking insulating layer 24, and the gate electrode 27. Differences between the energy band gaps may result in potential barriers at the interfaces between the materials.

For example, the charge storage layer 22 can include silicon nitride which has an energy band gap of about 5 eV. The corresponding potential barriers between the tunneling insulating layer 20 and the charge storage layer 22 may be about 1 eV and 2 eV, respectively, for the conduction band and the valence band.

A silicon nitride layer is known to have three trap levels. A trap center of the silicon nitride layer includes a silicon atom that combines with three nitrogen atoms and has one dangling bond. When no electron combines with the dangling bond (i.e., a hole combines therewith), the state may be called a first trap level $E_1$. When one electron combines with the dangling bond, the state may be called a second trap level $E_2$, which is higher than the first trap level $E_1$. When two electrons combine with the dangling bond, the state may be called a third trap level $E_3$, which is higher than the second trap level $E_2$.

A floating trap type non-volatile memory device uses trap levels, such as those found in a silicon nitride layer, for memory operations. When a positive voltage is applied on the gate electrode 27, electrons are tunneled via the tunneling insulating layer 20 to become trapped in the charge storage layer 22. As the electrons are accumulated in the charge storage layer 22, a threshold voltage of the memory device is increased, and the memory device becomes programmed.

In contrast, when a negative voltage is applied to the gate electrode 27 as shown in FIG. 3, trapped electrons are discharged to the semiconductor substrate 10 via the tunneling insulating layer 20. Concurrently, holes become trapped in the first trap level $E_1$ from the semiconductor substrate 10 by the tunneling insulating layer 20. Consequently, the threshold voltage of the unit memory device is decreased, and the memory device becomes erased.

For the memory device to be programmed, the quantity of charges from the channel should be relatively greater than the quantity of charges from the gate electrode. For example, when a positive voltage is applied to the gate electrode, if the quantity of holes provided from the gate electrode to the floating trap is equal to the quantity of electrons provided from the channel to the floating trap, negative charges are offset by positive charges and vice versa. Accordingly, the threshold voltage is not changed and programming may be precluded.

When the thickness of the silicon oxide layer, serving as a tunneling oxide layer, is 20 Å or less, current flow from direct tunneling may exceed current flow from F-N tunneling and an erase operation may occur. When a blocking oxide layer has a thickness of about 50 Å, charge may be primarily moved by F-N tunneling and the quantity of charges from the channel may be greater than the quantity of charges from the gate electrode. In contrast, when the thickness of the tunneling insulating layer is 20 Å or less and the blocking insulating layer is thicker than the tunneling insulating layer, charges may be primarily provided from the channel in erase and program operations, and the threshold voltage may be more easily controlled.

The thickness of the silicon oxide layer may affect the data retention time of the memory device. For example, when the thickness of the silicon oxide layer is 20 Å or less, charges stored in the floating trap may leak more easily and the data retention time of the memory device may be shortened. When the thickness of the silicon oxide layer is 20 Å or higher, the data retention time may be increased but the primary flow of charges to the floating trap may be by F-N tunneling. F-N tunneling may be more easily carried out as the effective mass of charge carriers becomes smaller and the electric field on the charge carrier path becomes stronger.

Conventional operations for programming and erasing a floating trap type memory device will now be described. During an early phase of a programming operation, when the tunneling insulating layer and the blocking insulating layer are oxide materials and a voltage is applied to the gate electrode, the generated electric field can be described by Equation 1 below.

$$Eot = Eob = \frac{Vg - \Phi ms - 2\Phi b}{Xot + \frac{\varepsilon(ot)}{\varepsilon(SIN)} + Xob} \quad \text{Equation 1}$$

The symbols "ot", "ob", and "SIN" represent the tunneling insulating layer, the blocking insulating layer, and the silicon nitride layer, respectively. The symbol "E" represents the electric field, "Vg" represents the voltage of a gate electrode, "Φms" represents a difference of a work function between the substrate and the gate electrode, "Φb" represents a substrate surface potential, "X" represents a thickness of the oxide layer, and "∈" represents a dielectric constant.

During the early phase of the programming operation, when a positive voltage is applied to the gate electrode, a hole is moved from the gate electrode to the floating trap and an electron is moved from the channel to the floating trap. When more electrons are provided to the gate electrode than holes, the threshold voltage is increased. As electrons become trapped in the floating trap of the charge storage layer and accumulate therein, the electric field applied to the blocking insulating layer may become stronger than the electric field applied to the tunneling insulating layer. Once stronger, trapped electrons become increasingly discharged via the blocking insulating layer, or holes become increasing injected from the gate electrode, so that growth of the threshold voltage becomes limited.

During an erasing operation, when a relatively lower voltage is applied to the gate electrode, electrons move by F-N tunneling from the gate electrode to the floating trap and holes move from the channel to the floating trap. Because the effective mass of electrons is lower than that of holes, electrons more easily flow from the gate electrode than holes from the channel. In an early phase of the erasing operation, when the floating trap of the silicon nitride layer (i.e., the charge storage layer) is uniformly filled with electrons, the quantity of charge, Q, may be negative. With a negative Q, the blocking insulating layer and the tunneling insulating layers can be described by Equations 2 and 3 below.

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob} \quad \text{Equation 2}$$

$$Eob = Eot + \frac{Q}{\varepsilon(ot)} \quad \text{Equation 3}$$

The symbols "ot", "ob", and "SIN" represent the tunneling insulating layer, the blocking insulating layer, and the silicon nitride layer, respectively. The symbol "E" represents an electric field, "Vg" represents a voltage of the gate electrode, "Φms" represents a difference of a work function between the substrate and the gate electrode, "Φb" represents a substrate surface potential, "X" represents a thickness of an oxide layer, and "Q" represents the quantity of charges at the silicon nitride layer.

When the thickness of the tunneling insulating layer is 20 Å or more, charges are moved at the tunneling insulating layer and the blocking insulating layer by F-N tunneling. During an erasing operation, the quantity of electrons provided from the gate electrode may exceed the quantity of holes provided from the channel and the floating trap can accumulate a negative charge, which may make it difficult to sufficiently decrease the threshold voltage to erase the memory.

SUMMARY OF THE INVENTION

Exemplary embodiments of the present invention are directed to a non-volatile memory device and a method of operating the same. In an exemplary embodiment, the non-volatile memory device may include a gate electrode disposed on a semiconductor substrate; a multiple tunnel insulation layer, a charge storage insulation layer, and a multiple blocking insulation layer sequentially stacked between the gate electrode and the semiconductor substrate; and a first region and a second region formed in a substrate adjacent to opposite sides of the gate electrode, respectively. When a voltage is applied to the gate electrode and the semiconductor substrate to make a voltage level difference therebetween, a minimum field in a tunnel insulation layer is stronger than a minimum field in a blocking insulation layer.

In another exemplary embodiment, the method may include applying a voltage between the gate electrode and the substrate to make a voltage level difference therebetween. Therefore, a minimum field established in the tunnel insulation layer is stronger than a minimum field established in the blocking insulation layer to store charges in the charge storage insulation layer or remove the stored charges.

BRIEF DESCRIPTION OF THE DRAWINGS

FIG. 24A through FIG. 27A illustrate methods of programming a non-volatile memory device according to some embodiments of the present invention.

FIG. 24B through FIG. 27B illustrate methods of erasing a non-volatile memory device according to some embodiments of the present invention.

DETAILED DESCRIPTION OF THE INVENTION

Figure 1:
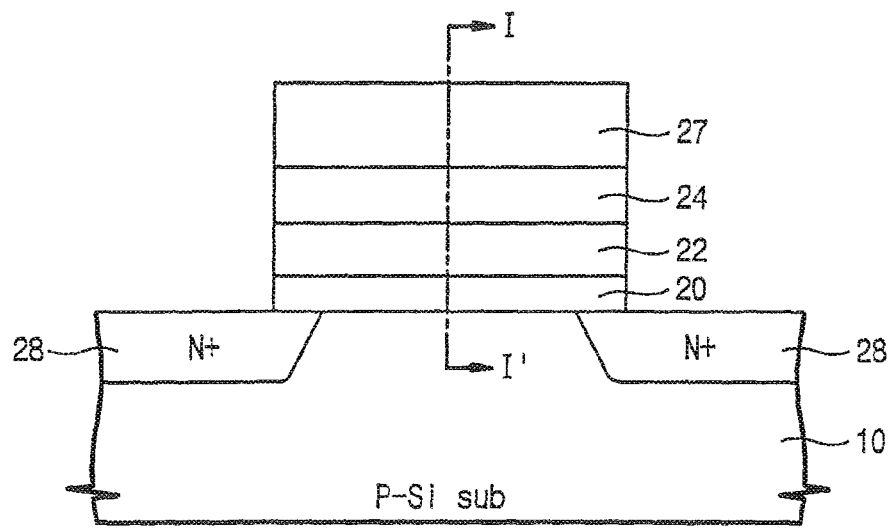
FIG. 1 is a cross-sectional view of a SONOS (silicon oxide nitride oxide semiconductor) structure of a conventional floating trap type unit memory device.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 4:
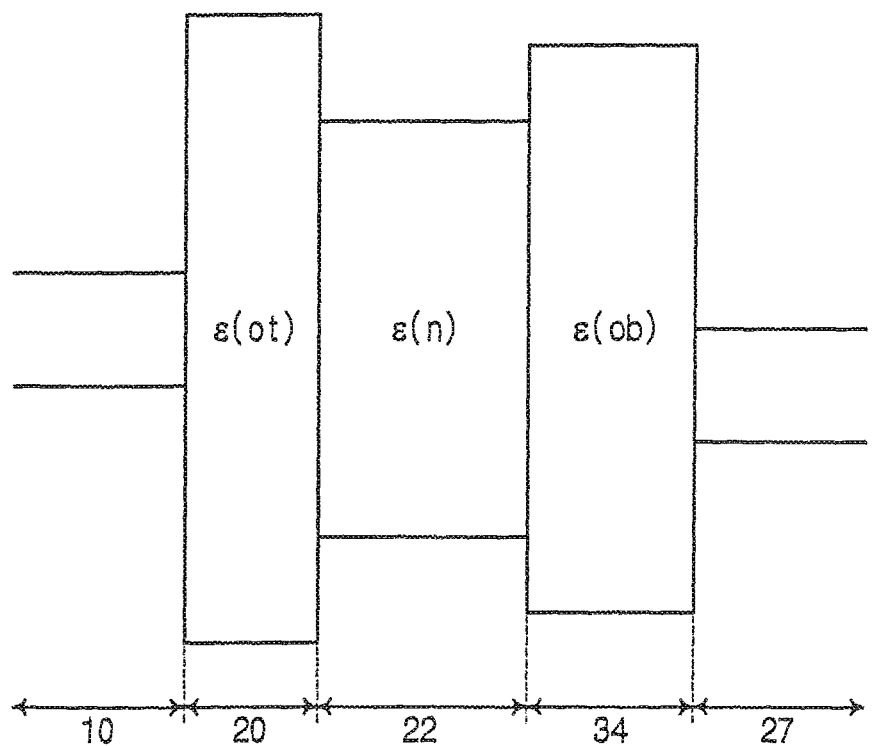
FIG. 4 is an energy band diagram of a floating trap type memory device according to some embodiments of the present invention.

An energy band diagram of a floating trap type memory device according to some embodiments of the present invention is shown in FIG. 4. The floating trap type memory device, as represented in the memory band diagram, may include a substrate 10, a tunneling insulating layer 20, a charge storage layer 22, a dielectric layer 34, and a gate electrode 27. The dielectric layer 34 may serve as a blocking insulating layer. Early in a programming operation of the memory device, electric field intensities of the tunneling insulating layer 20 and the blocking insulating layer 34 may be described by Equations 4 and 5 below.

$$Eot = \frac{Vg - \Phi ms - 2\Phi b}{Xot + Xn\frac{\varepsilon(ot)}{\varepsilon(n)} + Xob\frac{\varepsilon(ot)}{\varepsilon(ob)}} \quad \text{Equation 4}$$

$$Eob = Eot\frac{\varepsilon(ot)}{\varepsilon(ob)} \quad \text{Equation 5}$$

The symbols "ot", "ob", and "n" represent the tunneling insulating layer 20, the blocking insulating layer 34, and the charge storage layer 22, respectively. The symbol "E" represents an electric field, "Vg" represents a voltage of the gate electrode 27, "Φms" represents a difference of a work function between the substrate 10 and the gate electrode 27, "Φb" represents a substrate surface potential, "X" represents a thickness of an oxide layer, and "∈" represents a dielectric constant.

According to some embodiments of the present invention, a dielectric constant of the dielectric layer 34 may be higher than a dielectric constant of the tunneling insulating layer 20. A higher dielectric constant for the dielectric layer 34 may provide a higher electric field intensity for the tunneling insulating layer 20 than for the dielectric layer 34 (See Equation 5). When programming such a memory device, electrons may be more easily injected via the tunneling insulating layer 20 and a higher quantity of electrons may flow from the channel than a quantity of holes from the gate electrode 27. A result may be faster programming of the memory device.

Figure 3:
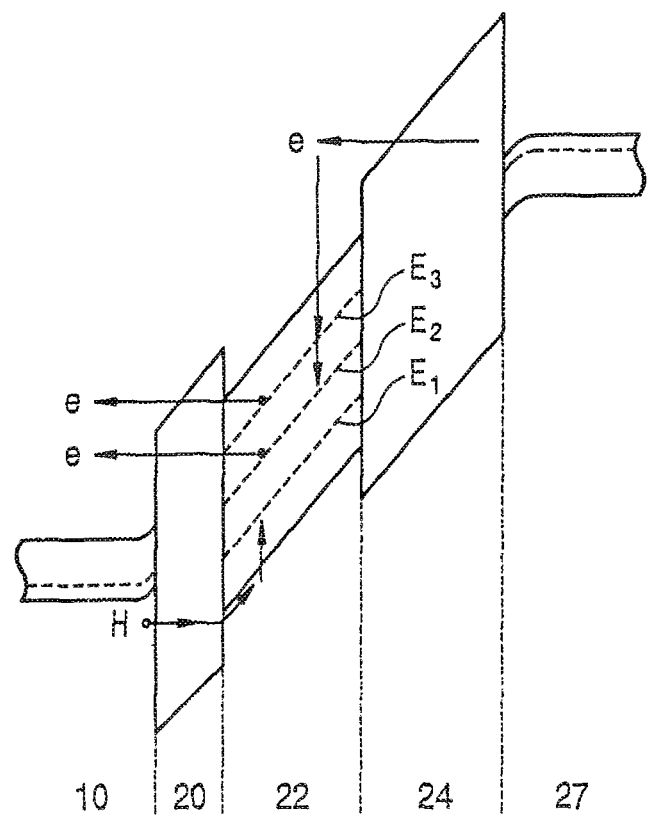
FIG. 3 is an energy band diagram of an energy band and carrier flow when a voltage is applied to a gate electrode of a conventional memory device, such as that shown in FIG. 2.

Referring to Equations 4 and 1, during programming of a floating trap type memory device according to embodiments of the present invention an electric field in the tunneling oxide layer 20 (hereinafter referred to as "$EF_P$") may be stronger than an electric field in the tunneling oxide layer 20 of FIG. 3 (hereinafter referred to as "$EF_C$"). When "EFc" is positive, a positive result may be obtained when "$EF_P$" is subtracted from "$EF_C$", as shown by Equation 6.

$$\Delta Eot = \frac{(Vg - \Phi ms - 2\Phi b)\left(1 - \frac{\varepsilon(ot)}{\varepsilon(ob)}\right)Xob}{\left(Xot + Xn\frac{\varepsilon(ot)}{\varepsilon(n)} + Xob\right)} \quad \text{[Equation 6]}$$

$$\left(Xot + Xn\frac{\varepsilon(ot)}{\varepsilon(n)} + Xob\frac{\varepsilon(ot)}{\varepsilon(ob)}\right)$$

Figure 2:
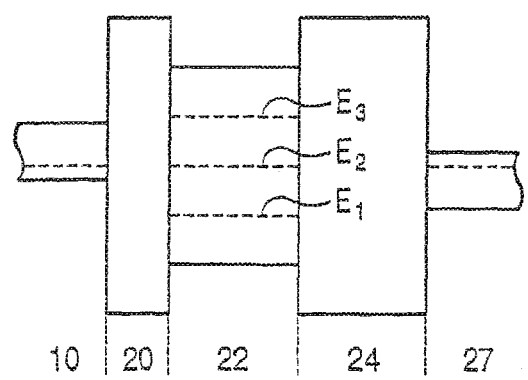
FIG. 2 is an energy band diagram of a conventional floating trap type unit memory device taken along a line of I-I' in FIG. 1.

The symbol "∈(ob)" represents a high dielectric constant of the dielectric layer 34. The high dielectric constant may provide a faster program operation of the memory relative to an equivalent voltage applied to a conventional memory device such as shown in FIG. 2.

The relationship of the electric fields strengths of the tunneling insulating layer 20 to the dielectric layer 34 during an erase operation may be described by Equations 7 and 8 below.

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob\frac{\varepsilon(ot)}{\varepsilon(ob)}} \quad \text{Equation 7}$$

-continued $$Eob = \left(Eot + \frac{Q}{\varepsilon(ot)}\right)\frac{\varepsilon(ot)}{\varepsilon(ob)} \quad \text{Equation 8}$$

The symbol "Q" represents a quantity of charges in the charge storage layer 22 and has a negative value, "∈(ob)" represents a dielectric constant of a dielectric layer 34, and "∈(ot)" represents a dielectric constant of the tunneling insulating layer 20.

When "∈(ob)" is sufficiently larger than "∈(ot)", the electric field of the tunneling insulating layer 20 may become stronger than the electric field of the dielectric layer 34. The change in the charge quantity caused by a charge carrier movement via the tunneling insulating layer 20 (i.e., inflow of channel holes and outflow of electrons from the charge storage layer 22) may be larger than the change in the charge quantity caused by a charge carrier movement via the dielectric layer 34 (i.e., inflow of electrons from the gate electrode 27). In such a case, the threshold voltage may be more easily decreased by the inflow of channel holes at the charge storage layer 22 and an erase operation may be more easily performed.

During an erase operation, the electric field applied to the tunneling insulating layer 20 of the memory device of FIG. 4 may be stronger than the electric field applied to a tunneling insulating layer 20 of the memory device of FIG. 2, as may be shown for example by Equation 6. In this manner, the speed of the erase operation may be increased.

Figure 5:
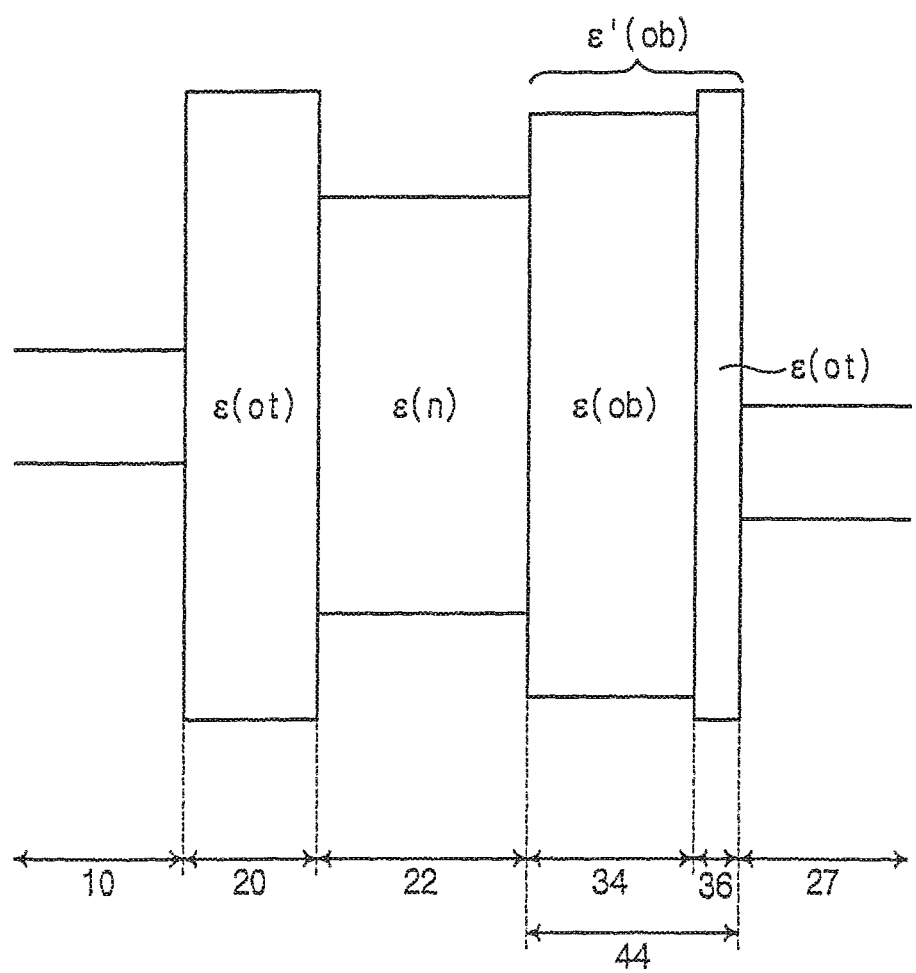
FIG. 5 is an energy band diagram of a floating trap type memory device according to additional embodiments of the present invention.

Referring to FIG. 5, a memory device according to additional embodiments of the present invention is shown. The memory device includes a semiconductor substrate 10, a tunneling insulating layer 20, a charge storage layer 22, a blocking insulating layer 44, and a gate electrode 27. The blocking insulating layer 44 may include a dielectric layer 34 having a high dielectric constant, and an interface layer 36 between the charge storage layer 22 and the gate electrode 27. More particularly, the interface layer 36 can be between the dielectric layer 34 and the gate electrode 27. The interface layer 36 has a dielectric constant which is lower than the high dielectric constant of the dielectric layer 34. The interface layer 36 may include silicon oxide. Additionally, the interface layer 36 may include at least one of silicon nitride, silicon oxynitride, silicon oxide, or combinations thereof.

Figure 6:
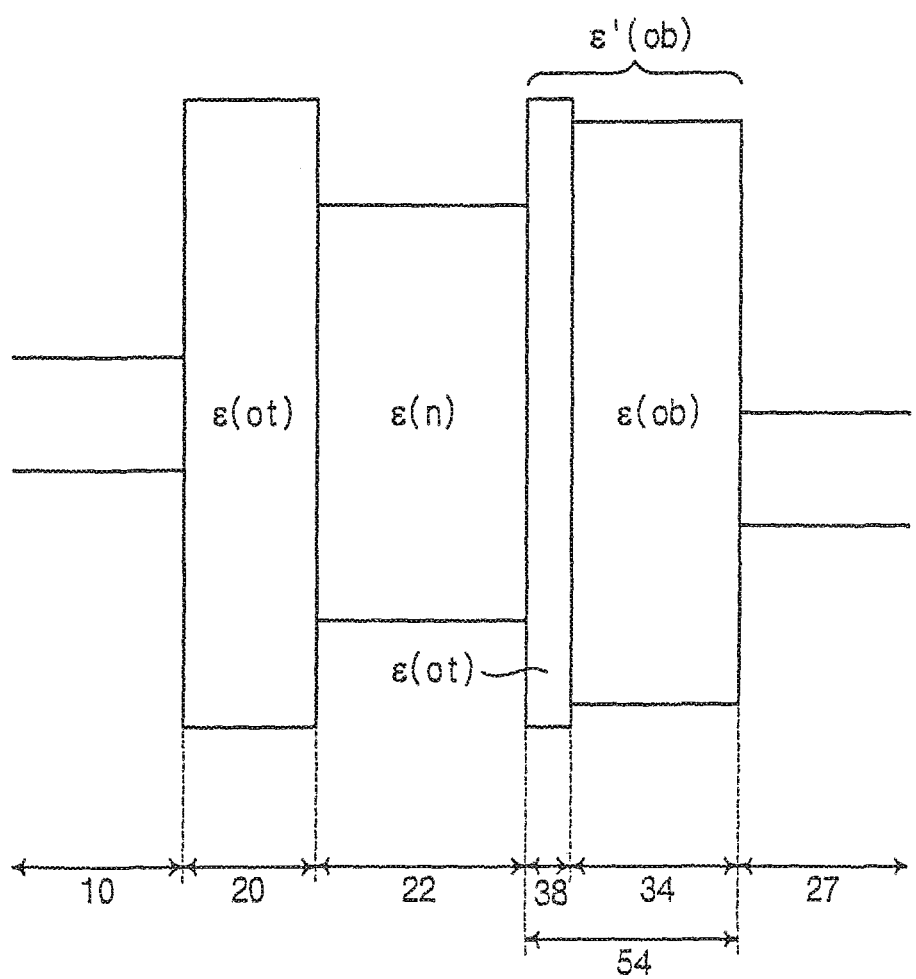
FIG. 6 is an energy band diagram of a floating trap type memory device according to additional embodiments of the present invention.

Referring to FIG. 6, a memory device according to additional embodiments of the present invention is shown. The memory device includes a semiconductor substrate 10, a tunneling insulating layer 20, a charge storage layer 22, a blocking insulating layer 54, and a gate electrode 27. The blocking insulating layer 54 includes a dielectric layer 34, having a high dielectric constant, and an interface layer 38 between the charge storage layer 22 and the gate electrode 27. More particularly, the dielectric layer 34 can be between the interface layer 38 and the gate electrode 27. The interface layer 38 has a dielectric constant which is lower than the high dielectric constant of the dielectric layer 34. The interface layer 38 may include silicon oxide. Additionally, the interface layer 38 may include at least one of silicon nitride, silicon oxynitride, silicon oxide, or combinations thereof.

Figure 7:
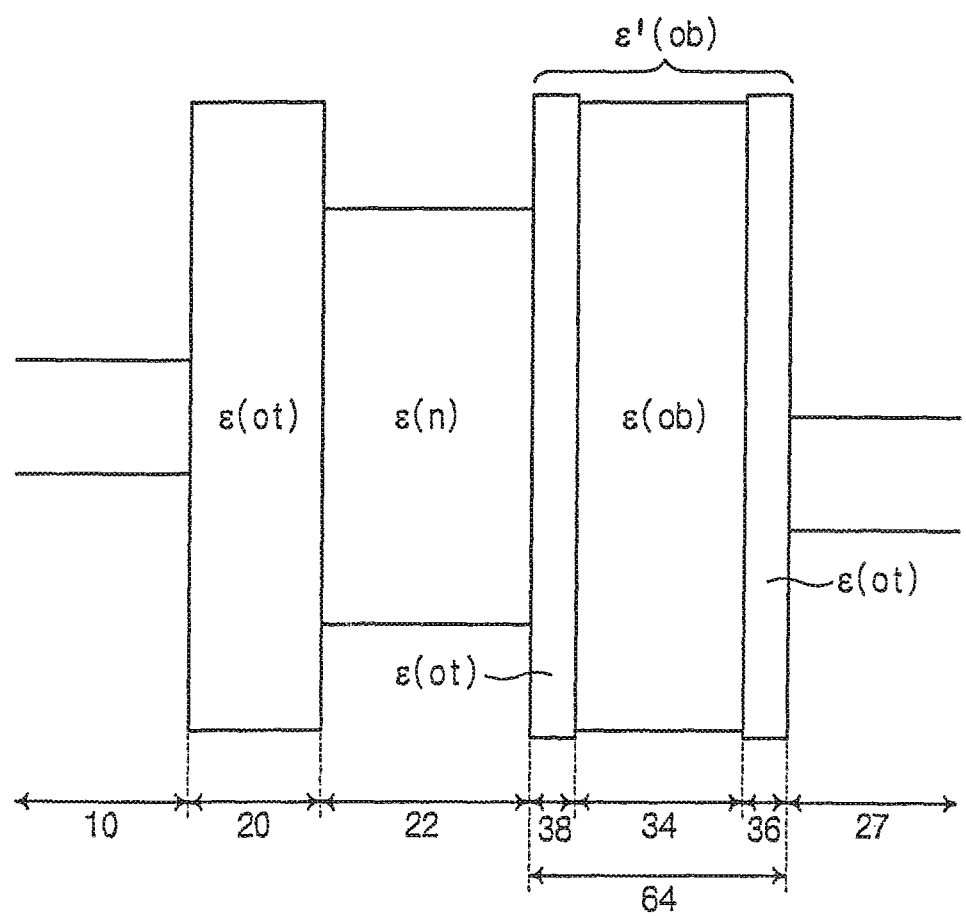
FIG. 7 is an energy band diagram of a floating trap type memory device according to additional embodiments of the present invention.

Referring to FIG. 7, a memory device according to additional embodiments of the present invention is shown. The memory device includes a semiconductor substrate 10, a tunneling insulating layer 20, a charge storage layer 22, a blocking insulating layer 64, and a gate electrode 27 disposed sequentially. The blocking insulating layer 64 includes a first interface layer 36 between a high dielectric layer 34 and a gate electrode 27 and a second interface layer 38 between the high dielectric layer 34 and the charge storage layer 22. The first interface layer 36 has a dielectric constant which is lower than the high dielectric constant of the dielectric layer 34. The first interface layer 36 may include silicon oxide. Additionally, the first interface layer 36 may include at least one of silicon nitride, silicon oxynitride, silicon oxide, or combinations thereof. The second interface layer 38 has a dielectric constant which is lower than the high dielectric constant of the dielectric layer 34. The second interface layer 38 may include silicon oxide. Additionally, the second interface layer 38 may include at least one of silicon nitride, silicon oxynitride, silicon oxide, or combinations thereof.

Equations 4 through 7 may describe the respective electric fields of the embodiments of the memory devices in FIGS. 4-7. For example, in the embodiments of FIGS. 5-7, a constant "∈(ob)" of the blocking insulating layers may be related to the constants of the dielectric layers and the interface layer of the blocking insulating layers. When a blocking insulating layer of these embodiments has the same thickness as the blocking insulating layer of the memory device of FIG. 2, the electric field may become dependent upon the dielectric constant and the thickness of the dielectric layer. The interface layer may enhance interface characteristics (e.g., adhesiveness, breakdown voltage, etc.) between the high dielectric layer and the gate electrode and/or between the high dielectric layer and the charge storage layer. In particular, when the interface is formed of silicon oxide, the interface layer of the blocking insulating layer may increase a breakdown voltage of the blocking insulating layer, and the interface layer may also enhance an adhesiveness between the high dielectric layer and the gate electrode or between the high dielectric layer and the charge storage layer.

According to additional embodiments of the present invention, the dielectric layer 34 may comprise metallic oxide or metallic oxynitride of a group III element or group VB element in the Mendeleef Periodic Table. According to other embodiments, the dielectric layer 34 may comprise doped metal oxide or doped metal oxynitride in which metal oxide is doped with a group IV element in the Mendeleef Periodic Table. The group IV element may reduce leakage current from the memory device. The group IV element may be doped with a metal oxide of about 0.1-30 weight percent. The dielectric layer 34 may also comprise one of more of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and combinations thereof.

The material $Al_2O_3$ has a dielectric constant of 10 and an energy band gap of 8.3 eV and the material $ZrO_2$ has a dielectric constant of 25 and an energy band gap of 8.3 eV. The dielectric layer 34 may also comprise one or more of AlO, $Al_2O_3$, $Ta_2O_5$, $TiO_2$, PZT [Pb(Zr, Ti)$O_3$], $PbTiO_3$, $PbZrO_3$, PZT [(Pb, La)(Zr, Ti)$O_3$], PbO, $SrTiO_3$, $BaTiO_3$, $V_2O_5$, BST [(Ba, Sr)$TiO_3$], SBT ($SrBi_2Ta_2O_9$), $Bi_4Ti_3O_{12}$, and combinations thereof.

The charge storage layer 22 may comprise one or more of $Si_3N_4$, silicon oxynitride, silicon-rich oxide, and other ferroelectric materials.

Figure 8:
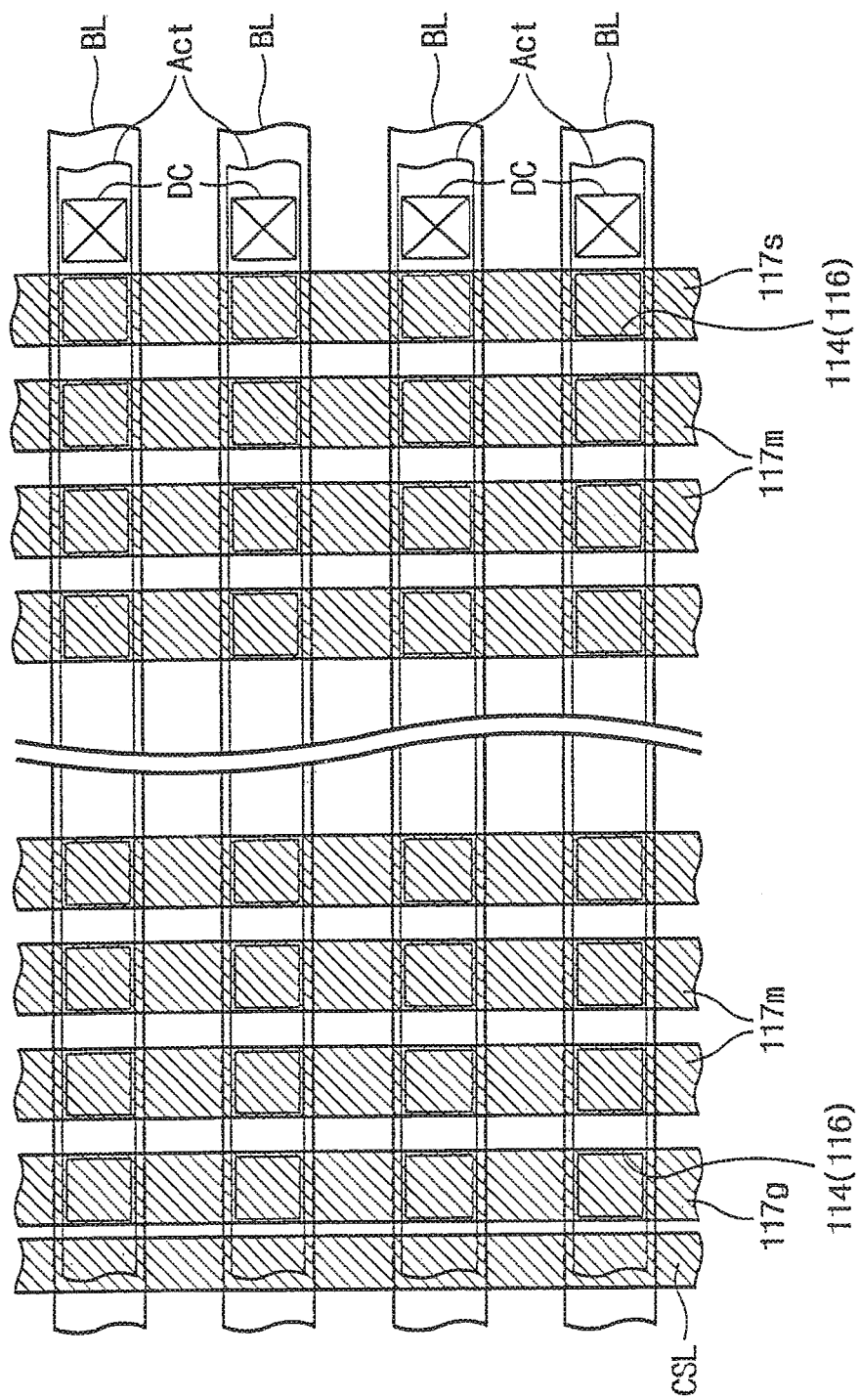
FIG. 8 is a plan view of a memory device according to some embodiments of the present invention.
Figure 9:
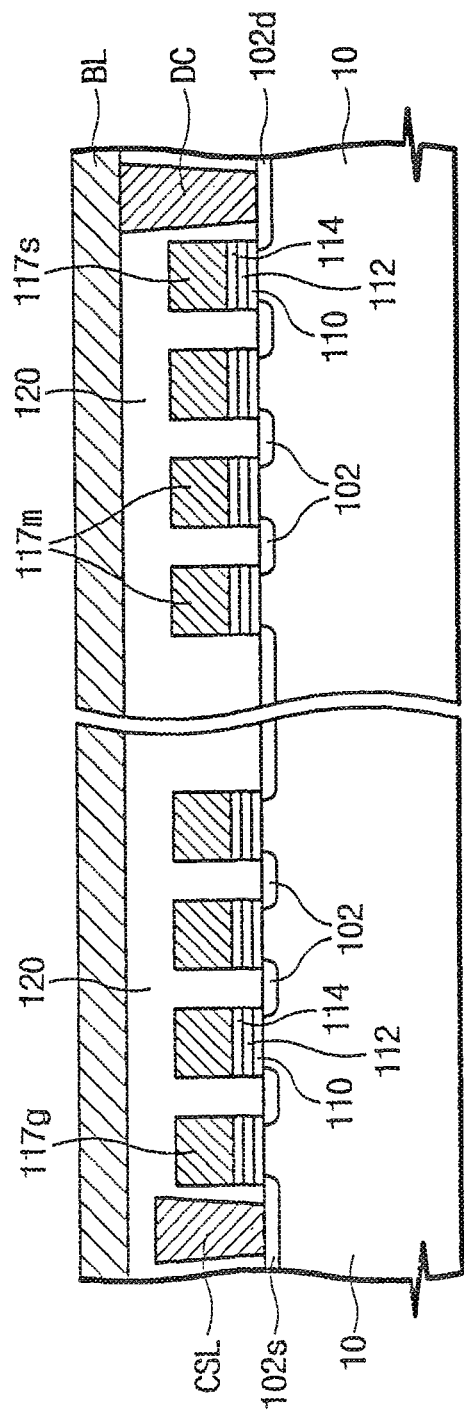
FIG. 9 is a cross-sectional view along a bit line of a memory device, such as the memory device of FIG. 8, according to some embodiments of the present invention.
Figure 10:
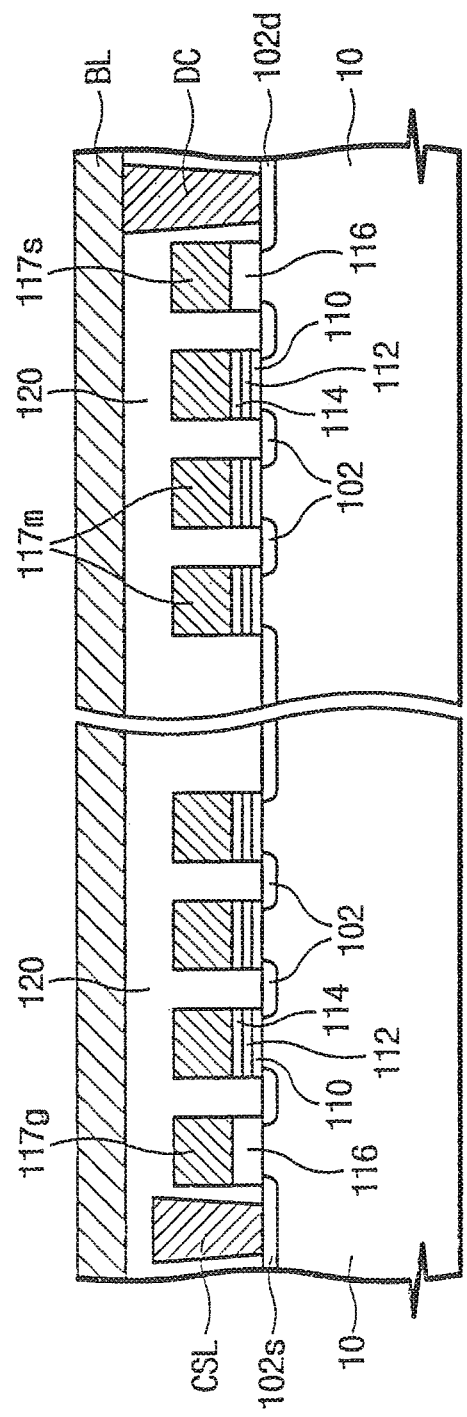
FIG. 10 is a cross-sectional view along a bit line of a memory device, such as the memory device of FIG. 8, according to additional embodiments of the present invention.

Referring to FIGS. 8-10, memory devices according to additional embodiments of the invention are shown. A plurality of active regions ACT are disposed on a semiconductor substrate 10. The active regions ACTs are parallel with one another along one direction of the substrate 10. A common source line CSL crosses over the active regions ACT. Bitline plugs DC are connected to the respective active regions ACT and separated from the common source line CSL by a predetermined distance. The bitline plugs DCs are parallel to the common source line CSL.

A string selection gate electrode 117s and a ground selection gate electrode 117g are parallel with each other, and cross over the active regions ACTs between the common source line CSL and the bitline plugs DCs. The string selection gate electrode 117s is adjacent to the bitline plugs DCs, and the ground selection gate electrode 117g is adjacent to the common source line CSL.

Between the string selection gate electrode 117s and the ground selection gate electrode 117g, a plurality of memory gate electrodes 117m cross over the active regions ACTs. The memory gate electrodes 117m are parallel with one another. A tunneling insulating layer 110, a charge storage layer 112, and a blocking insulating layer 114 are sequentially stacked between the active regions ACTs and the memory gate electrodes 117m. The tunneling insulating layer 110, the charge storage layer 112, and the blocking insulating layer 114 can comprise the same materials as previously described.

An impurity-doped region 102 is on opposite sides of the string selection gate electrode 117s, the ground selection gate electrode 117g, and the memory gate electrodes 117m. The common source line CSL is connected to the respective impurity-doped region (source region) 102s that is adjacent to the ground selection electrode 117g. An interlayer insulating film 120 covers the surface of a semiconductor substrate including the gate electrodes 117g, 117m, and 117s and the common source line CSL. The bitline plugs DCs are connected to impurity-doped regions (drain regions) 102d adjacent to the string selection gate 117s. A plurality of bitlines BLs are formed on the interlayer insulating film 120 to cross over the gate electrodes 117g, 117m, and 117s. The bitlines BLs are electrically connected to the bitline plug DC.

Memory cells may be provided at intersections of the respective memory gate electrodes 117m and the active regions ACTs. Selection transistors may be provided at intersections of the respective selection gates 117s and 117g and the respective active regions ACTs.

As shown in FIG. 9, the memory device may include a tunnel insulating layer 110, a charge storage layer 112, and a blocking insulating layer 114 sequentially stacked to be between the ground selection gate electrode 117g and the string selection gate electrode 117s and the active regions (ACTs of FIG. 8). A negative voltage may be applied to the ground selection gate electrode 117g and the string selection gate electrode 117s to lower the threshold voltage of the selection transistor during memory operations.

According to further embodiments, as shown in FIG. 10, the memory device can include a gate insulating layer 116 between each of the ground selection gate electrode 117g and the string selection gate electrode 117s and the active regions (ACTs of FIG. 8). The gate insulating layer 116 can comprise silicon oxide, silicon oxynitride, or a combination thereof.

Figure 11:
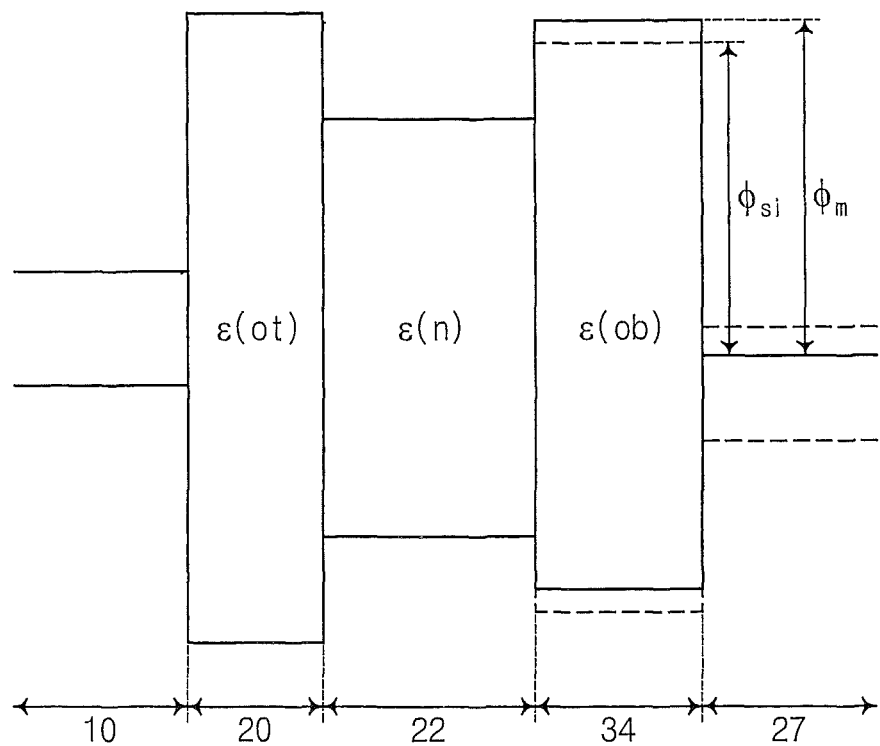
FIG. 11 is an energy band diagram of a floating trap type memory device according to some additional embodiments of the present invention.

An energy band diagram of a floating trap type memory device according to additional embodiments of the present invention is shown in FIG. 11. The floating trap type memory device includes a substrate 10, a tunneling insulating layer 20, a charge storage layer 22, a blocking insulating layer (e.g., dielectric layer) 34, and a gate electrode 27, as was earlier described for the floating trap type memory device that is shown in FIG. 4. The floating trap type memory device that is shown in FIG. 11 differs from that shown in FIG. 4 in that a portion of the gate electrode 27 adjacent to the blocking insulating layer 34 has a higher work-function than polysilicon. The gate electrode 27 may be a metal layer. As shown in FIG. 11, the work-function ($\Phi m$) of the metal layer is higher than the work-function ($\Phi si$) of the polysilicon layer.

Because the gate electrode 27 has a higher work-function ($\Phi m$) than the work-function ($\Phi si$) of the polysilicon layer, a higher potential barrier may be provided between the blocking insulating layer 34 and the gate electrode 27. During an erase mode, while electrons in the charge storage layer 22 are tunneling through the tunneling insulating layer 20 into the substrate 10, electrons may tunnel through the blocking insulating layer 34 from the gate electrode 27 into the charge storage layer 22. The occurrence of tunneling though the blocking insulating layer 34 to the charge storage layer 22 may be reduced by increasing the potential barrier between the blocking insulating layer 34 and the gate electrode 27. The performance of the floating trap type memory device that is shown in FIG. 11 may thereby be increased during an erase mode relative to the floating trap type memory device that has a polysilicon gate electrode.

The metal layer of the gate electrode 27 may have a work-function of, for example, at least 4 eV. The metal layer may be, for example, Titanium (Ti), Titanium nitride (TIN), Tantalum nitride (TAN), Tantalum (Ta), Tungsten (W), Hafnium (Hf), Niobium (Nb), Molybdenum (Mo), Ruthenium dioxide ($RuO_2$), Molybdenum nitride ($Mo_2N$), Iridium (Ir), Platinum (Pt), Cobalt (Co), Chrome (Cr), Ruthenium monoxide (RuO), Titanium aluminide ($Ti_3Al$), $Ti_2AlN$, Palladium (Pd), Tungsten nitride (WNx), Tungsten silicide (WSi) and Nickel silicide (NiSi), and/or combinations thereof.

Figure 12:
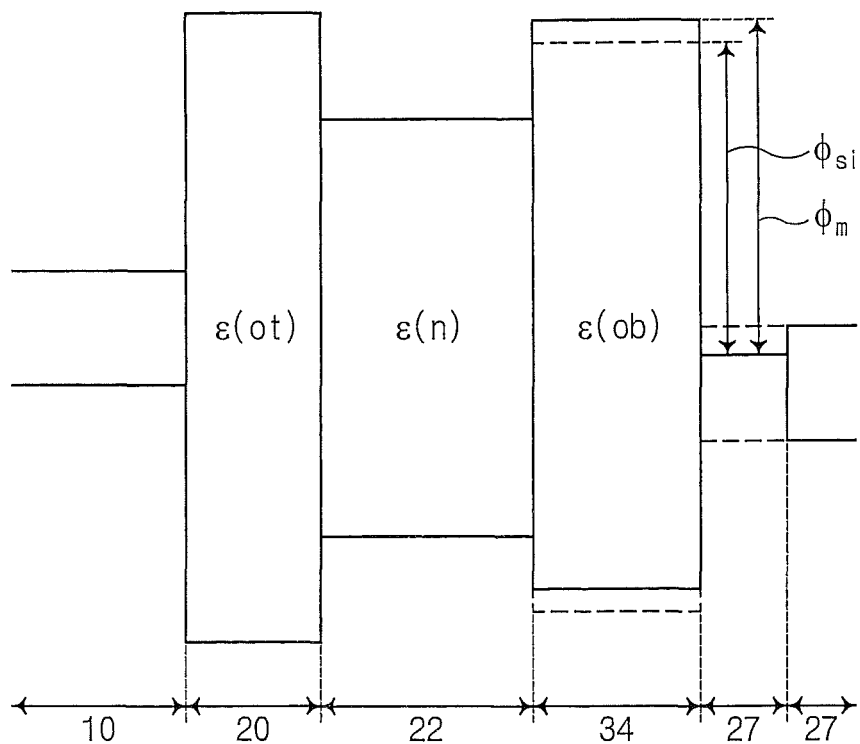
FIG. 12 is an energy band diagram of a floating trap type memory device according to some additional embodiments of the present invention.

An energy band diagram of a floating trap type memory device according to additional embodiments of the present invention is shown in FIG. 12. As shown in FIG. 12, the gate electrode includes a stacked metal layer 27 and a polysilicon layer 27'. The work-function ($\Phi m$) of the metal layer 27 is higher than the work-function ($\Phi si$) of the polysilicon layer 27'. Accordingly, a higher potential barrier is provided between the gate electrode layers 27 and 27' and the blocking insulating layer 34. The potential barrier may increase the performance of the floating trap type memory device during an erase mode.

The gate electrodes that are shown in FIGS. 11 and 12 may be used in the floating trap type memory devices that are shown in FIGS. 5-10. Further, the gate electrodes and insulating layers that are shown in FIGS. 5-12 may be used in floating gate type memory devices and non-volatile memory devices with a nanocrystalline layer.

Figure 13:
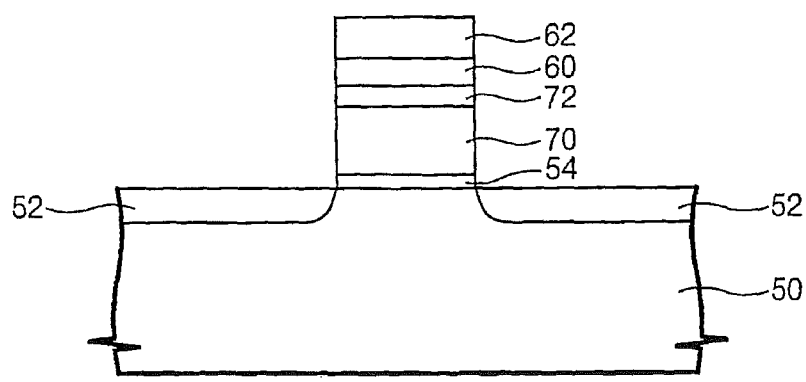
FIG. 13 is a cross-sectional view of a floating gate type non-volatile memory device according to some embodiments of the present invention.

FIG. 13 is a cross-sectional view of a floating gate type non-volatile memory device according to some embodiments of the present invention.

Referring to FIG. 13, the memory device includes a tunneling insulating layer 54, a floating gate 70, a blocking insulating layer 72 (i.e., an inter-gate dielectric layer), and a gate electrode that are sequentially stacked on an active region of a P-type semiconductor substrate 50. A portion of the gate electrode adjacent to the blocking insulating layer 72 has a higher work-function than polysilicon. The gate electrode may include a stacked metal layer 60 and a polysilicon layer 62. The work-function of the metal layer 60 is higher than the work-function of the polysilicon layer 62. An $N^+$ type impurity diffusion layer 52 is formed at an active region on opposite sides of the gate electrode. The tunnel insulating layer 54 and the blocking insulating layer 72 may be same as that was earlier described for the floating trap type memory device that is shown in FIGS. 4-7.

Figure 14:
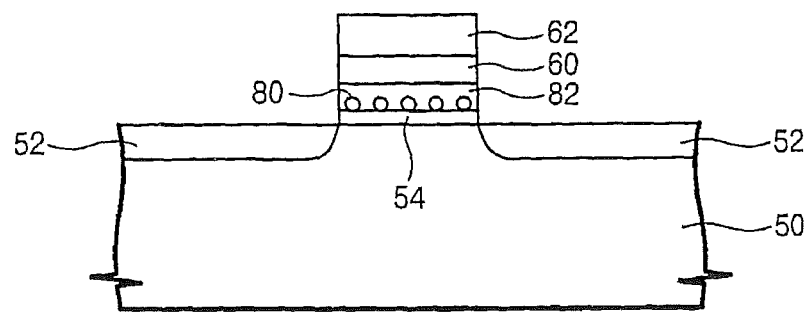
FIG. 14 is a cross-sectional view of a non-volatile memory device with a nanocrystalline layer according to some embodiments of the present invention.

FIG. 14 is a cross-sectional view of a non-volatile memory device with a silicon nanocrystalline layer according to some embodiments of the present invention.

Referring to FIG. 14, the memory device includes a tunneling insulating layer 54, a floating gate 80, a blocking insulating layer 82, and a gate electrode that are sequentially stacked on an active region of a P-type semiconductor substrate 50. The floating gate 80 is formed as a silicon nanocrystalline layer. The nanocrystalline layer is used as conductive layer to replace with a polysilicon floating gate in FIG. 13. A portion of the gate electrode adjacent to the blocking insulating layer 82 has a higher work-function than polysilicon. The gate electrode may include a stacked metal layer 60 and a polysilicon layer 62. The work-function of the metal layer 60 is higher than the work-function of the polysilicon layer 62. An N+ type impurity diffusion layer 52 is formed at an active region on opposite sides of the gate electrode. The tunnel insulating layer 54 and the blocking insulating layer 72 may be the same as that was earlier described for the floating trap type memory device that is shown in FIGS. 4-7.

Figure 15:
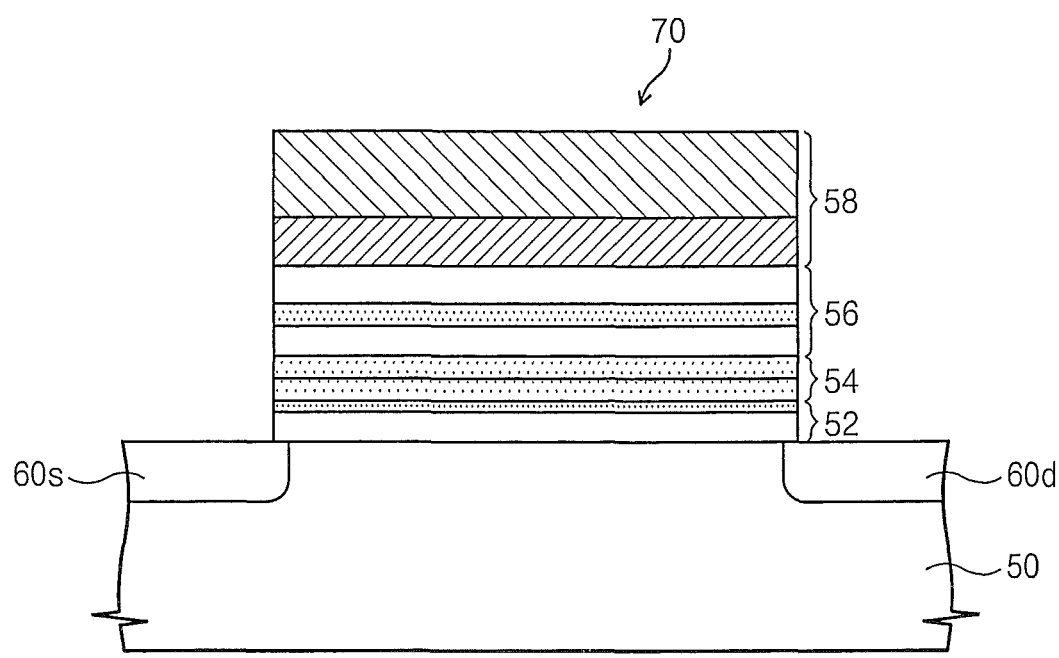
FIG. 15 is a cross-sectional view of a non-volatile memory device according to an embodiment of the present invention.

FIG. 15 is a cross-sectional view of a non-volatile memory device according to an embodiment of the present invention. In the non-volatile memory device, a first diffusion region 60s and a second diffusion region 60d are formed. A semiconductor substrate between the first and the second diffusion regions 60s and 60d is defined as a channel region of the non-volatile memory device. A tunnel insulation layer 52, a charge storage insulation layer 54, and a blocking insulation layer 56 are sequentially stacked on the channel region. A gate electrode 58 is disposed on the blocking insulation layer 56. The tunnel insulation layer 52 and the blocking insulation layer 56 may include a plurality of insulation layers, respectively. Also, the charge storage insulation layer 54 may include a plurality of insulation layers.

The tunnel insulation layer 52 and the blocking insulation layer 56 may include at least one insulation layer made of one or more materials selected from the group consisting of Al2O3, hafnium aluminate, and hafnium silicate. The hafnium aluminate may be, for example, HfAlO or HfAlON, and the hafnium silicate may be, for example, HfSiO or HfSiON. Each of the insulation layers has an intrinsic dielectric constant. When a voltage is applied between the gate electrode 58 and the substrate 50 to make a voltage level difference therebetween, a minimum field established in the tunnel insulation layer 52 is required to be higher than a minimum field established in the blocking insulation layer 56. As described previously, the charge tunneling probability based on F-N tunneling is dependent on an electric field of a charge migration path and effective mass of charges. Accordingly, when a minimum field in a tunnel insulation layer is higher than a minimum field in a blocking insulation layer, the probability of F-N tunneling occurring through the tunnel insulation layer is higher than that of F-N tunneling occurring through the blocking insulation layer. In a structure where insulation layers are stacked, an electric field applied to the insulation layers is inversely proportional to a dielectric constant. To increase the probability of F-N tunneling occurring through a tunneling insulation layer, the blocking insulation layer 56 includes an insulation layer having a higher dielectric constant than an insulation layer having the highest dielectric constant among insulation layers of the tunnel insulation layer 52. The insulation layer having the highest dielectric constant among the insulation layers of the tunnel insulation layer 52 may be made of the same kind of material as the insulation layer having the highest dielectric constant among layers of the blocking insulation layer 56. Although they are made of the same material, if a blocking insulation layer is formed to be thicker than a tunnel insulation layer, the amount of charges tunneling through a tunnel insulation layer may increase.

The tunnel insulation layer 52 may be made of only silicon oxide except for the foregoing insulation layers. The silicon oxide is formed to have a thickness of at least 25 angstroms, which may prevent direct tunneling from occurring across the silicon oxide. Further, the tunnel insulation layer may include a silicon oxide (SiON) layer, a nitride silicon oxide layer disposed at a surface of the tunnel insulation layer or a silicon oxide layer having a nitrided portion contacting a substrate.

The charge storage insulation layer may include at least one insulation layer having a higher dielectric constant than silicon oxide. The charge storage insulation layer may be, for example, a single or multi-layer having a higher dielectric constant than a silicon oxide layer or the single or multi-layer including a silicon oxide layer. An insulation layer having a higher dielectric constant than silicon oxide may be made of one materials selected from the group consisting of, for example, hafnium aluminate and hafnium silicate. The hafnium aluminate may be HfAlO or HfAlON, and the hafnium silicate may be HfSiO or HfSiON. These insulation layers may be included in a blocking insulation layer. In a case where, among these insulation layers, the same insulation layers can constitute the charge storage insulation layer and the blocking insulation layer, a constitution ratio of hafnium in the charge storage insulation layer is made higher than that of hafnium in the blocking insulation layer to increase a trap density of the charge storage insulation layer and to enhance an insulation characteristic of the blocking insulation layer.

The charge storage insulation layer may include a dot-shaped insulated conductor. That is, dot-shaped conductors are uniformly distributed on the tunnel insulation layer 52 and an insulation layer covers these conductors to be electrically insulated. The dot-shaped conductor may include silicon, germanium, and/or metal.

The tunneling probability of charges migrating from the gate electrode 58 to the charge storage insulation layer 54 through the blocking insulation layer 56 is inversely proportional to a work function of a gate electrode 58 adjacent to the blocking insulation layer 57. Conventionally, the gate electrode 58 is made of N-type silicon. Since N-type polysilicon has a work function of 4.0 eV, the gate electrode 58 adjacent to the blocking insulation layer 56 is made of a conductor having a higher work function than 4.0 eV to reduce the probability of charges tunneling through the blocking insulation layer 56. The gate electrode 58 adjacent to the blocking insulation layer 56 may be made of a conductor such as metal or P-type doped silicon having a higher work function than 4.0 eV that is a work function of N-type silicon. The gate electrode 58 adjacent to the blocking insulation layer 56 may be made of one material selected from the group consisting of P-type silicon, Ti, TiN, TaN, TaTi, TaSiN, Ta, W, Hf, HfN, Nb, Mo, $RuO_2$, RuO, $Mo_2N$, WN, WSi, NiSi, $Ti_3Al$, $Ti_2AlN$, Pd, Ir, Pt, Co, Cr, CoSi, NiSi, and AlSi.

When a voltage is applied between a gate electrode and a substrate to make a voltage level difference therebetween, a minimum field established at a tunnel insulation layer is stronger than a minimum field established at a blocking insulation layer. Accordingly, when charges migrating through a tunnel insulation layer and a blocking insulation layer tunnel by F-N tunneling, the tunneling probability of charges migrating through the tunnel insulation layer is higher than that of charges migrating through the blocking insulation layer. The following equation [Equation 9] illustrates a relationship between a gate voltage applied to a substrate and an electric field under an initial state.

$$V = E_{ot}\left(X_{ot} + \frac{\varepsilon_{ot}}{\varepsilon_k}X_k + \frac{\varepsilon_{ot}}{\varepsilon_{ob}}X_{ob}\right) \qquad \text{[Equation 9]}$$

wherein V represents a gate voltage applied to a substrate;
subscripts ot, k, ob represent a tunnel insulation layer, a charge storage insulation layer, and a blocking insulation layer, respectively;
E represents an electric field in an insulation layer;
X represents a thickness of an insulation layer; and
∈ represents a dielectric constant.

According to the equation [Equation 9], when an electric field $E_{ot}$ is applied to a tunnel insulation layer, electric fields having magnitudes $$\frac{\varepsilon_{ot}}{\varepsilon_k}E_{ot} \text{ and } \frac{\varepsilon_{ot}}{\varepsilon_{ob}}E_{ot}$$

are established at a charge storage insulation layer and a blocking insulation layer, respectively. Assuming that $E_{ot}$ is a minimum field for enabling charges to tunnel a tunnel insulation layer, a lower electric field than $E_{ot}$ is established at a charge storage insulation layer and a blocking insulation layer. Therefore, it is possible to suppress tunneling of charges stored in a charge storage insulation layer through a blocking insulation layer and tunneling of charges from a gate electrode through a blocking insulation layer.

Exemplary embodiments of the present inventions may be expressed as energy band diagrams. FIG. 16 through FIG. 19, FIG. 20A, FIG. 20B, FIG. 29, and FIG. 30 are energy band diagrams of non-volatile memory devices according to exemplary embodiments of the present invention. For the convenience of description, the energy band diagrams show coupling of energy bands of respective materials without consideration of band bending resulting from thermal equilibrium. However, it will be understood that Fermi level is constant in an overall system and an energy band may be bent by an internal electric field established by a difference between work functions.

Figure 16:
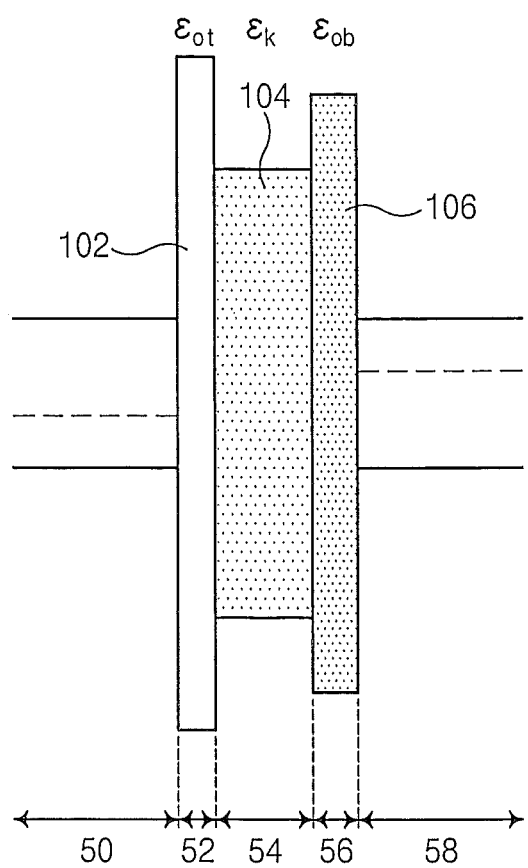
FIG. 16 through FIG. 19, FIG. 20A, FIG. 20B, FIG. 21, and FIG. 22 are energy band diagrams of non-volatile memory devices according to some embodiments of the present invention.

Referring to FIG. 16, a tunnel insulation layer 52, a charge storage insulation layer 54, and a blocking insulation layer 56 of the semiconductor device may be a single layer, respectively. As previously stated, the tunnel insulation layer 52 may be made of silicon oxide 102; the charge storage insulation layer 54 may be made of a material having higher work function and trap density than silicon oxide, e.g., silicon nitride, silicon oxynitride or high-k dielectric; and the blocking insulation layer 56 may include at least one insulation layer made of a material having a higher dielectric constant than the silicon oxide 102, e.g., one or more selected from the group consisting of $Al_2O_3$, hafnium aluminate, and hafnium silicate. The hafnium silicate may be, for example, HfSiO or HfSiON. A substrate 50 may be a semiconductor substrate doped with P-type impurities. A gate electrode 58 may be a semiconductor doped with N-type impurities and be made of amorphous, single-crystalline or poly-crystalline silicon or silicon germanium.

Figure 17:
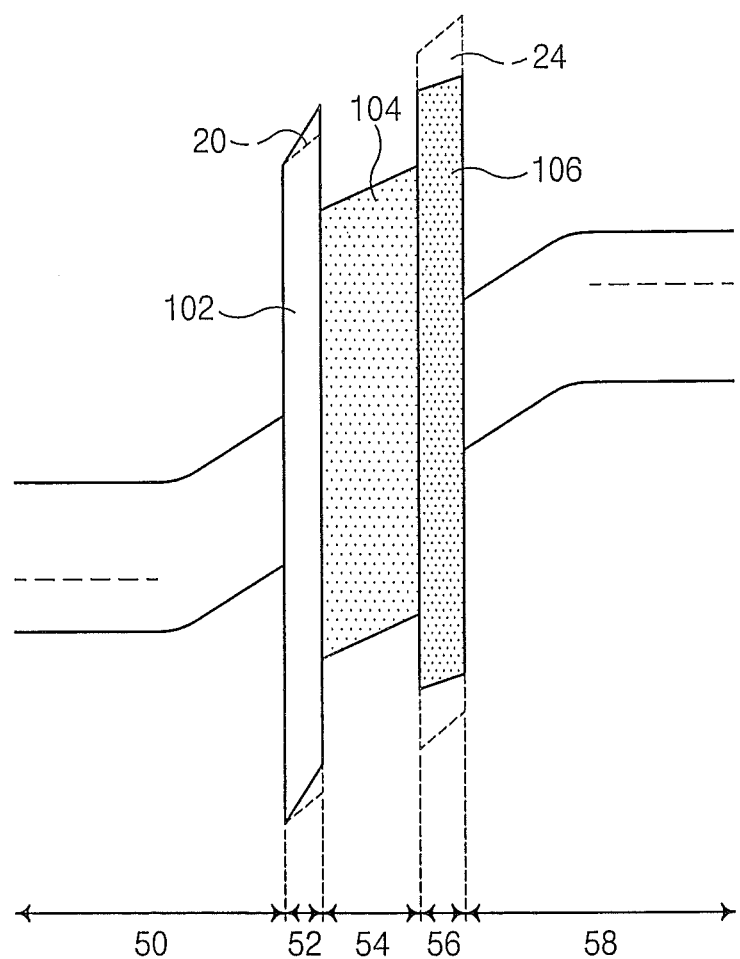

The silicon oxide 102 can have a thickness of at least 25 angstroms where the direct tunneling probability is rapidly reduced, which may prevent charges stored in the charge storage insulation layer 54 from tunneling during a maintenance state. When migration of charges is done by F-N tunneling, not direct tunneling, an electric field established at a tunnel insulation layer 52 should be higher than an electric field established at a blocking insulation layer 56. FIG. 6 is a diagram for explaining the tendency of F-N tunneling based on a dielectric constant of a blocking insulation layer relative to a tunnel insulation layer 52. That is, FIG. 17 is an energy band diagram of a conventional non-volatile memory device in which a blocking insulation layer 56 is made of silicon oxide layer 24 and a non-volatile memory device according to some embodiments of the invention in which a blocking insulation layer 56 is high-k dielectric 106 having a higher dielectric constant than the silicon oxide 24.

If a negative voltage V is applied to a gate electrode 58, it is distributed to respective insulation layers. A voltage applied to both ends of the respective insulation layers may be expressed as an internal electric field and a thickness of an insulation layer, as described in the equation [Equation 9]. When a gate voltage V is equivalently applied, an electric field is equivalently established at a tunnel insulation layer 52 and a blocking insulation layer 56, which are all made of silicon oxides 20 and 24, of a conventional non-volatile memory device. Meanwhile, in some embodiments of the present invention, a tunnel insulation layer 52 is made of silicon oxide 102 and a blocking insulation layer 56 is made of an insulator 106 having a higher dielectric constant than silicon oxide. For this reason, from the equation [Equation 9], it is understood that a ratio of an electric field $E_{ot}$ established at a tunnel insulation layer to an electric field $E_{ob}$ established at a blocking insulation layer is $\in_{ob}:\in_{ot}$, and an electric field established at a blocking insulation layer is more weakened than an electric field of a conventional non-volatile memory device and a stronger electric field is established at a tunnel insulation layer 52.

In some embodiments of the present invention, a tunnel insulation layer 52 may be a single layer of silicon oxide or a multi-layer of silicon oxide and insulator, having a higher dielectric constant than the silicon oxide, which are stacked in the order named. The tunnel insulation layer 52 may be made of, for example, silicon oxide and silicon oxynitride which are stacked in the order named, a structure in which a surface of silicon oxide is nitride to form nitride on the silicon oxide or the content of nitrogen increases gradually to successively change it into silicon oxide-silicon oxynitride-silicon nitride or silicon oxide of which a boundary portion contacting a substrate is nitrified.

Figure 18:
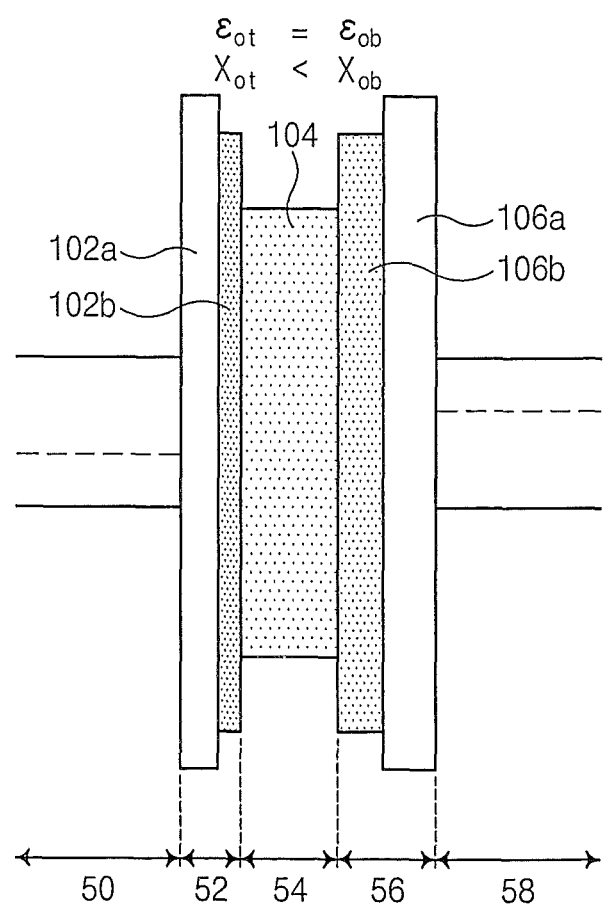

FIG. 18 is an energy band diagram of a non-volatile memory device including a multiple tunnel insulation layer and a multiple blocking insulation layer.

Referring now to FIG. 18, a tunnel insulation layer 52 is made of silicon oxide 102a and insulator 102b having a higher dielectric constant than the silicon oxide 102a. A blocking insulation layer 56 may be made of silicon oxide 106a and insulator 106b having a higher dielectric constant than the silicon oxide 106a. As illustrated, silicon oxide 102a may be interposed between the insulator 102b having a higher dielectric constant and a substrate 50, which is not limited thereto. Insulator 102b having a higher dielectric constant may be interposed between the silicon oxide 102a and the substrate 50 or silicon oxide 102a may be stacked on/beneath insulator 102b or insulator 102b may be stacked on/beneath silicon oxide 102a. Similarly, the blocking insulation layer 56 may have a stack structure including silicon oxide 106a and insulator 106b having a higher dielectric constant than the silicon oxide 106a. Further, the tunnel insulation layer 52 and the blocking insulation layer 56 may include a multi-layer of insulators each having a higher dielectric constant than silicon oxide. The insulators comprising the multi-layer can be insulators of the same or different kinds.

When a voltage level difference is applied between the substrate 50 and the gate electrode 58, an electric field is established at respective insulators of the tunnel insulation layer 52 and the blocking insulation layer 56. The following equation [Equation 10] shows a relationship between a voltage and an electric field.

$$V = E_{ot}\left(X_{ot_1} + \varepsilon_{ot_1}\sum \frac{X_{ot_1}}{\varepsilon_{ot_1}} + \varepsilon_{ot_1}\sum \frac{X_{k_m}}{\varepsilon_{k_m}} + \varepsilon_{ot_1}\sum \frac{X_{ob_n}}{\varepsilon_{ob_n}}\right)$$ [Equation 10]

wherein subscripts ot, k, and ob represent a tunnel insulation layer, a charge storage insulation layer, and a blocking insulation layer, respectively;

l, m, and n represent identification numerals of a tunnel insulation layer, a charge storage insulation layer, and a blocking insulation layer, respectively (l being 1 to the number of tunnel insulation layers and m and n being 1 to the number of charge storage insulation layers and blocking insulation layers, respectively);

E represents an electric field established at an insulation layer; and

X represents a thickness of an insulation layer.

Figure 19:
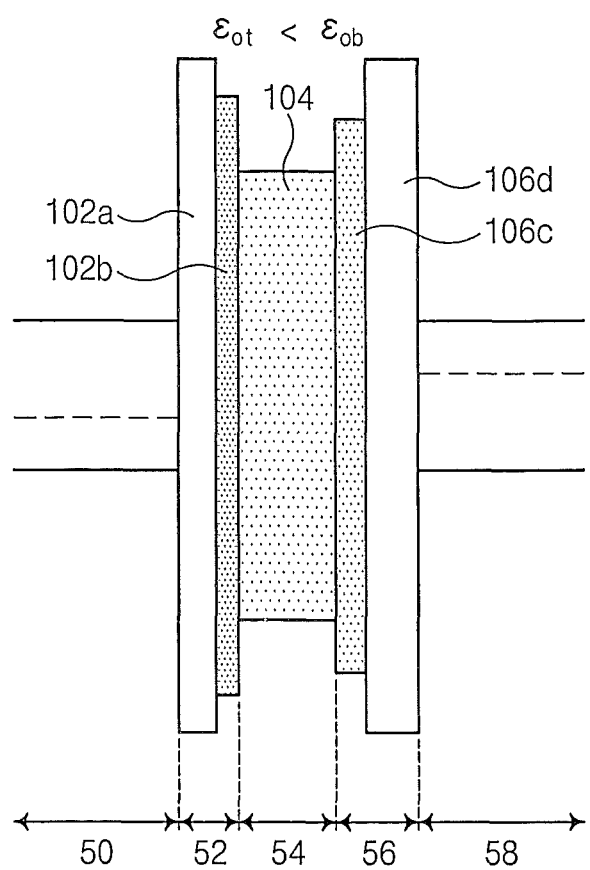

Further, $ot_1$ represents is an insulation layer where a lowest high electric field is established. Assuming that an electric field established at the insulation layer $ot_1$ is $E_{ot}$, electric fields established at insulators of a tunnel insulation layer, a charge storage insulation layer, and a blocking insulation layer are inversely proportional to their intrinsic dielectric constants. As a result, with increase of dielectric constants of insulators of a blocking insulation layer and a charge storage insulation layer, program and erase voltages may decrease and an electric field established at the tunnel insulation layer may become stronger than an electric field established at the blocking insulation layer. When charges are tunneled by F-N tunneling, assuming that the amount of charges tunneled through the blocking insulation layer 56 is C1 and the amount of charges tunneled through the tunnel insulation layer 52 is C2. In order to make C2 larger than C1 (i.e., C2>C1), as shown in FIG. 19, an insulator having the highest dielectric constant ($\in_{ot}$) among insulators of the tunnel insulation layer 52 has a lower dielectric constant than an insulator having the highest dielectric constant ($\in_{ob}$) among insulators of the blocking insulation layer 56. The tunnel insulation layer 52 and the blocking insulation layer 56 may include at least one insulation layer made of one or more materials selected from the group consisting of, for example, $Al_2O_3$, hafnium aluminate, and hafnium silicate. The hafnium aluminate may be, for example, HfAlO or HfAlON. The hafnium silicate may be, for example, HfSiO or HfSiON. If an insulation layer is included in both a tunnel insulation layer 52 and a blocking insulation layer 56, a thickness of the insulation layer is smaller at the tunnel insulation layer 52 than at the blocking insulation layer 56. If an insulation layer having the highest dielectric constant in the tunnel insulation layer 52 is made of the same kind of a material as an insulation layer having the highest dielectric constant in the blocking insulation layer 56, an insulation layer having the highest dielectric constant is thinly formed at a tunnel insulation layer to increase the direct tunneling probability of charges through the insulation layer, as illustrated in FIG. 18.

The charge storage insulation layer 54 may be made of a material having the same or higher dielectric constant as the blocking insulation layer 56. On the other hand, the charge storage insulation layer 54 may be made of the same material as the blocking insulation layer 56. In this case, a dielectric constant of the material of the charge storage layer 54 is higher than that of the material of the blocking insulation layer 56 and constitution ratios of the layers 54 and 56 are different so as to increase a trap density.

FIG. 20 is an energy band diagram, in which a charge storage layer and a blocking insulation layer are made of the same materials having different constitution ratios.

Figure 20A:
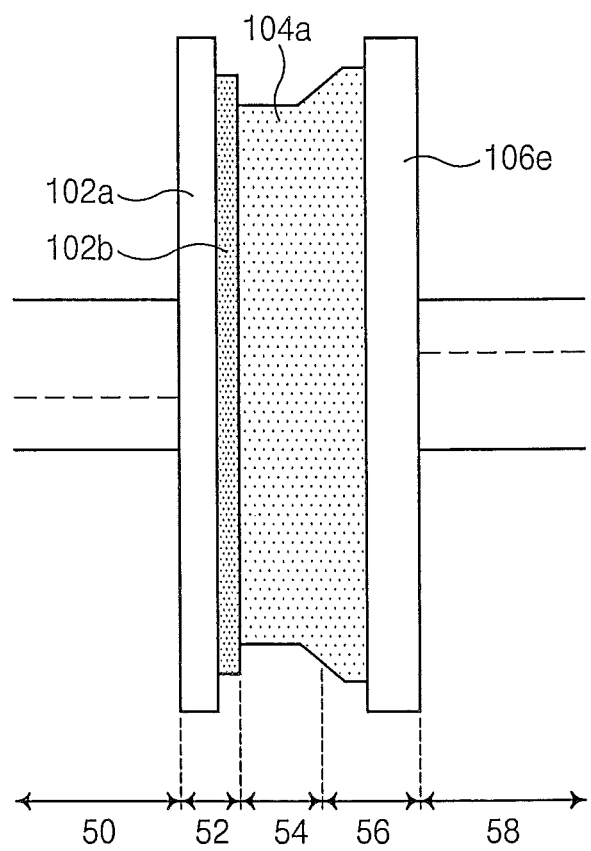
Figure 20B:
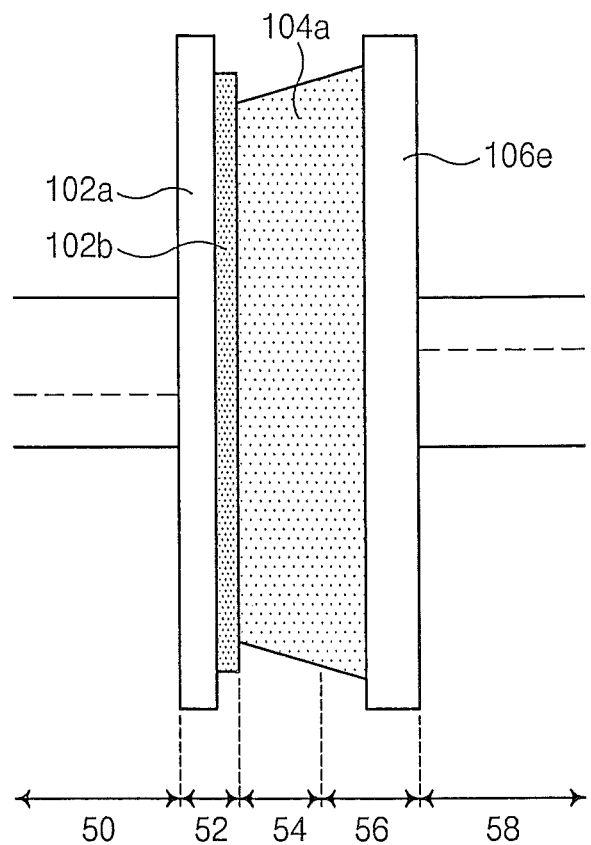

Referring to FIG. 20A and FIG. 20B, the charge storage layer 54 and the blocking insulation layer 56 may be made of high-k dielectric including hafnium. High-k dielectric including hafnium such as, for example, hafnium aluminate and/or hafnium silicate. The hafnium aluminate may be HfAlO or HfAlON, and the hafnium silicate may be HfSiO or HfSiON. A charge storage insulation layer may be used to have high trap density and work function, and a blocking insulation layer is required to have a superior insulating property. As a constitution ratio of hafnium increases, a trap density, a dielectric constant, and a work function of the above materials including hafnium become higher. As the constitution ratio of hafnium decreases, an insulating property of the above materials including hafnium becomes superior. Therefore, if a charge storage insulation layer and a blocking insulation layer are successively formed and the supply amount of hafnium source decreases gradually, insulation layers each having advantageous characteristics may be formed. In this case, an energy band structure of FIG. 20A or FIG. 20B may be formed by gradually decreasing the supply amount of hafnium source from the initial stage to the end of formation of a material layer or by keeping the supply amount of the hafnium source for a predetermined time from the initial stage of formation of the material layer and for a predetermined time prior to the end of formation of the material layer. Even in this case, silicon oxide 106e may be further formed on a material layer including hafnium and a tunnel insulation layer may be also a multi-layer.

FIG. 16 through FIG. 20 show various embodiments of a non-volatile memory device in which structures and constituents of a tunnel insulation layer 52, a charge storage insulation layer 54, and a blocking insulation layer 56 are changed to achieve characteristics of embodiment of the present invention. These embodiments may be applied independently or combined within the scope of the present invention to be modified variously. In embodiments of the present invention, more improved operations and effects may be obtained by changing a structure and a constituent of an insulation layer as well as by changing a gate electrode. Specifically, the tunneling probability of charge migrating to a blocking insulation layer from a gate electrode may be reduced by increasing a work function of the gate electrode.

Figure 21:
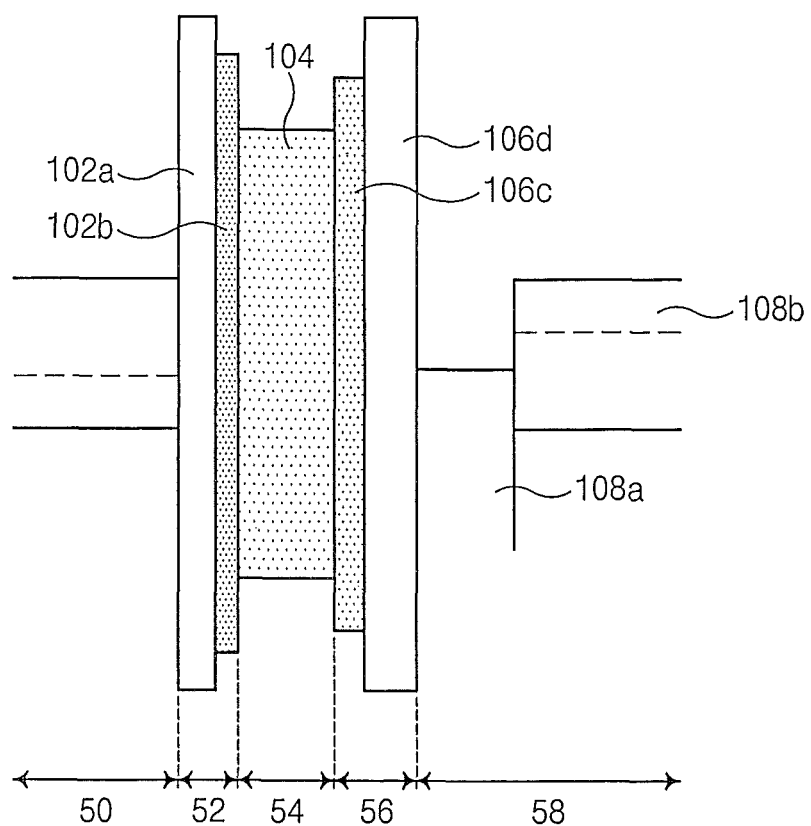

FIG. 21 is an energy band diagram where a gate electrode is made of a metal having a high work function. Referring to FIG. 21, a gate electrode 58 is generally made of polysilicon 108a doped with N-type impurities. Conventionally, a work function of silicon doped with N-type impurities is about 4.0 eV. In the embodiments of the present invention, a gate electrode includes a material 108b having a higher work function than 4.0 eV that is a work function of silicon doped with N-type impurities. A material having a higher work function than 4.0 eV is formed at a portion contacting a blocking insulation layer 56, so that a potential barrier of a blocking insulation layer relative to a gage electrode is raised to reduce the tunneling probability of charges passing the blocking insulation layer from the gate electrode. For this reason, the migration probability of charges through a tunnel insulation layer 52 is higher than that of charges through a blocking insulation layer 56. Therefore, it is expected to achieve lower program and erase voltages, high-speed program and erase operations, increase of a difference between a program threshold voltage and an erase threshold voltage.

Materials having a higher work function than 4.1 eV are metals such as, for example, Ti, TiN, TaN, TaTi, TaSiN, Ta, W, Hf, HfN, Nb, Mo, $RuO_2$, $Mo_2N$, WN, WSi, NiSi, $Ti_3Al$, $Ti_2AlN$, Pd, Ir, Pt, Co, Cr, and Al. Also, silicide including these materials has a higher work function than 4.1 eV. A gate electrode may be stacked conductive layers made of these materials.

Figure 22:
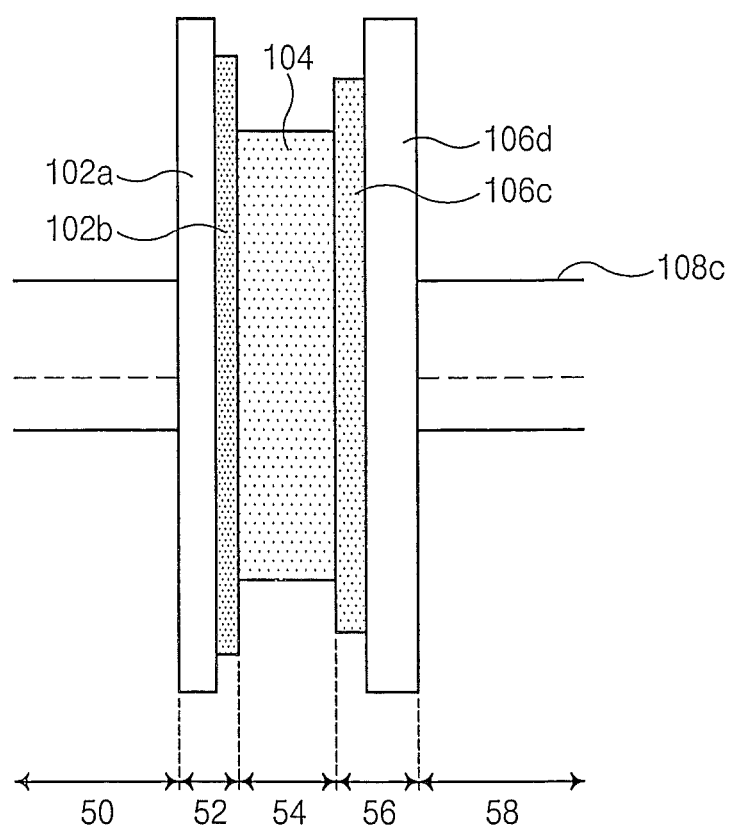

The materials having a higher work function than 4.1 eV are not limited to the above metals, and these metals and silicide are merely exemplary. Except the above metals and silicide, a doped semiconductor may have a higher work function than 4.0 eV. Referring to FIG. 22, silicon doped with P-type impurities or silicon germanium has a high work function because its Fermi level is nearer the valence band than the conduction band. With increase of a difference between work functions of a blocking insulation layer 56 and a gate electrode 58, a barrier against charges is strengthened to reduce the tunneling probability of the charges.

According to some embodiments of the present invention, a charge storage insulation layer includes at least one layer of material having a higher work function than silicon oxide and is made of only insulators. But the charge storage insulation layer may include a part of a conductive layer without departing the spirit of the present invention.

Figure 23:
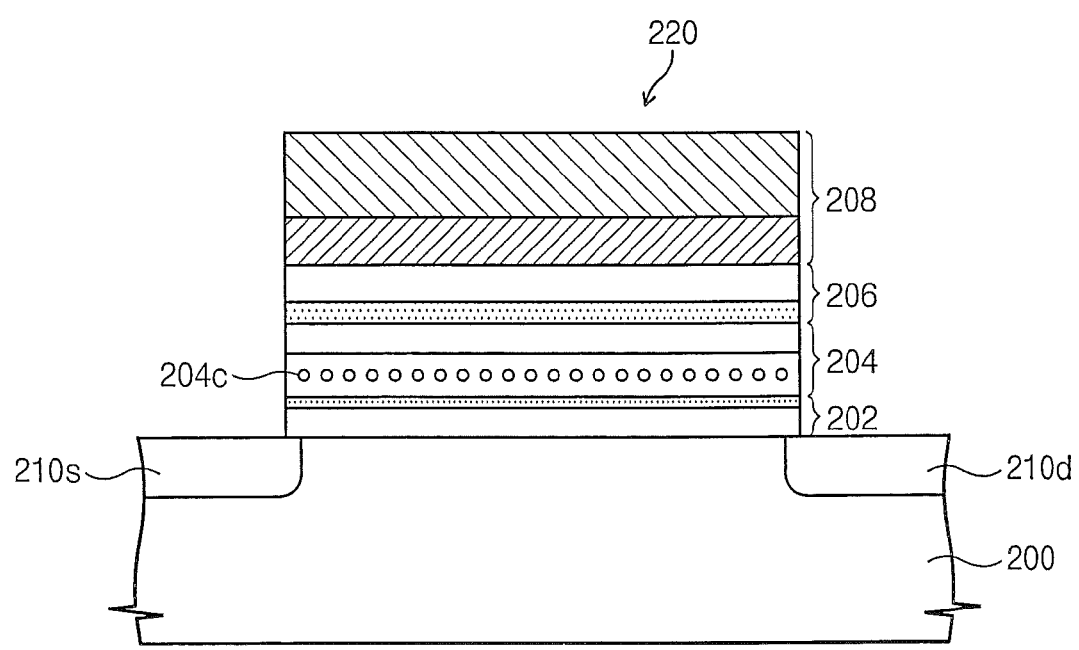
FIG. 23 is a cross-sectional view of a non-volatile memory device according to another embodiment of the present invention.

FIG. 23 is a cross-sectional view of a non-volatile memory device having a charge storage layer including a conductive layer. Referring to FIG. 23, a charge storage layer may further include a conductor 240c insulated by an insulation layer 24. The conductor 240c may have a dot shape having a size of several nanometers and be uniformly distributed in a charge storage insulation layer. The dot-shaped conductor 240c may be made of a metal or a doped semiconductor and may be formed by stopping a deposition process for forming a seed layer when the seed layer grows with a predetermined size.

In a non-volatile memory device according to the invention, the charge tunneling probability through a tunnel insulation layer is higher than the charge tunneling probability through a blocking insulation layer. Therefore, the non-volatile memory device may operate using various program, read, and erase methods. Further, a difference between threshold values of a program threshold voltage and an erase threshold voltage is great enough to program and read a plurality of data bits.

FIG. 24A through FIG. 27A illustrate embodiments of a program method of a non-volatile memory device according to the present invention, and FIG. 24B through FIG. 27B illustrate embodiments of an erasing method of a non-volatile memory device according to some embodiments of the present invention.

Figure 24A:
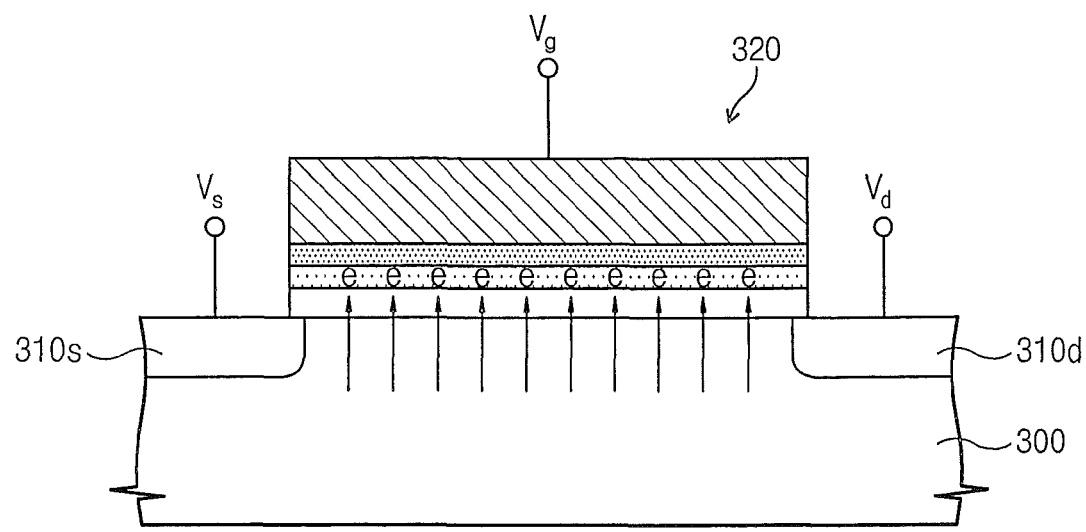
Figure 24B:
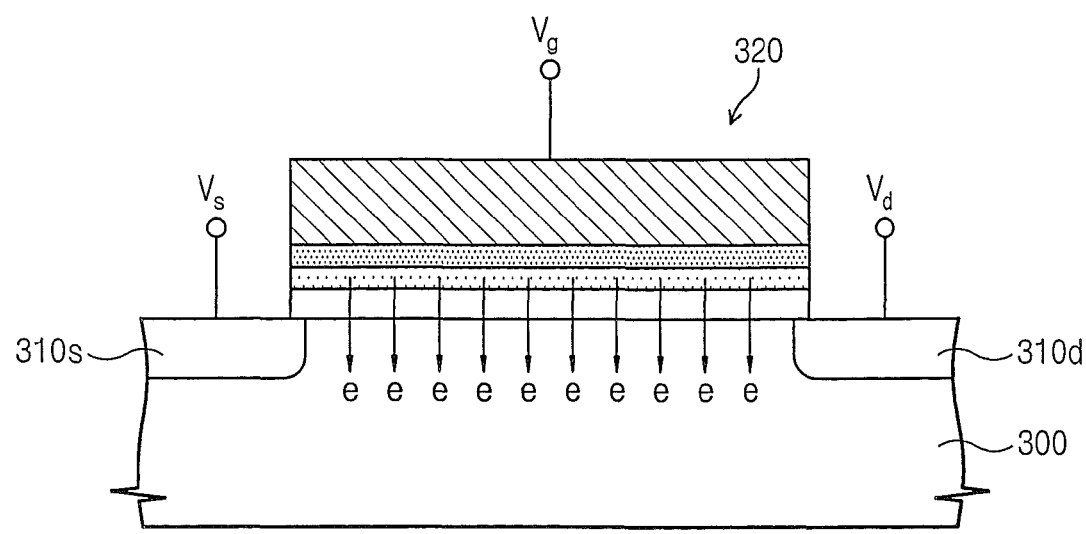

Referring to FIG. 24A and FIG. 24B, an operating method of the non-volatile memory device includes a program operation in which electrons are introduced into a tunnel insulation layer by F-N tunneling and an erase operation in which the electrons stored in the tunnel insulation are discharged by F-N tunneling. There may be flow of holes migrating in an opposite direction to electrons.

In order to introduce electrons into a charge storage insulation layer, a positive program voltage Vg is applied to a gate electrode 320, a ground voltage or a negative voltage is applied to a substrate, and a first diffusion region 310s and a second diffusion region 310d are grounded or floated. If an electric field is established at a tunnel insulation layer by a program voltage Vg, electrons migrate to the charge storage layer from a channel region defined on a substrate between the first diffusion region 310s and the second diffusion region 310d. Further, holes stored in the charge storage insulation layer may be tunneled to a substrate 300 through the tunnel insulation layer.

In the non-volatile memory device according to some embodiments of the invention, a minimum value of an electric field established at a tunnel insulation layer is greater than that of an electric field established at a blocking insulation layer. For this reason, although electrons are accumulated in a charge storage layer to increase potential of the electrons, a threshold value of a program threshold voltage may increase because critical value of the electrons is high. Further, time required for reaching a predetermined program threshold voltage may be shortened.

In order to reduce a total amount of charges by discharging electrons injected into a charge storage insulation layer or introducing holes into the charge storage insulation layer, a negative program voltage Vg is applied to a gate electrode 320, a ground voltage or a positive voltage is applied to a substrate, and a first diffusion region 310s and a second diffusion region 310d are floated. Undoubtedly, a minimum field established at a tunnel insulation layer is stronger than a minimum field applied to a blocking insulation layer during this procedure. Thus, although electrons migrate from a gate electrode to a charge storage insulation layer, an erase threshold voltage may drop fast and a threshold value of the erase threshold voltage may decrease because there is a large amount of electrons discharged to a substrate from a tunnel insulation layer.

As a result, in a case where a predetermined threshold voltage level is set to a program state and an erase state, time required for reaching the state is shortened to enhance program and erase speeds. Since there is a large difference between threshold values of a program threshold voltage and an erase threshold voltage, a number of threshold voltage values are set between these threshold values to offer data bits corresponding to the respective threshold voltage values. Thus, a multi-valued non-volatile memory device may be fabricated.

Now, voltages applied to a substrate during program and erase operations will be described. For example, a voltage of 12-30 volts may be applied to a gate electrode and a substrate may be grounded or a voltage of 10 volts may be applied to the gate electrode and a voltage of −20~−2 volt may be applied to the substrate during a program operation. To the contrary, for example, a voltage of −30~−12 volt may be applied to a gate electrode and a substrate or a voltage of −10 volt may be applied to the gate electrode and a voltage of 2~20 volts may be applied to the substrate during an erase operation.

A method of storing each data in a charge storage insulation layer of a portion adjacent to a diffusion region will now be described with reference to FIG. 25A and FIG. 25B. The method includes establishing a horizontal electric field at a channel region and establishing a vertical electric field to cross a tunnel insulation layer. Under a high energy state, electrons accelerated by the horizontal electric field are injected into a charge storage insulation layer through a tunnel insulation layer by the vertical electric field in the vicinity of a diffusion region to which a high voltage is applied. Since electrons of the high energy state stored in a charge storage insulation layer over a potential barrier, injection of the electrons may be done at a lower electric field than F-N tunneling. Therefore, although a minimum field established at a tunnel insulation layer is stronger or weaker than a minimum field established at a blocking insulation layer, a program voltage may be low and a program speed and a threshold value of a program threshold voltage may increase during a program operation using channel hot electron injection (CHE). Charge migration resulting from F-N tunneling requires a program voltage of 12~30 volts applied between a gate electrode and a substrate, while injection of electrons may be done even using a low voltage of about 10 volts if hot electrons of a high energy state are injected.

Figure 25A:
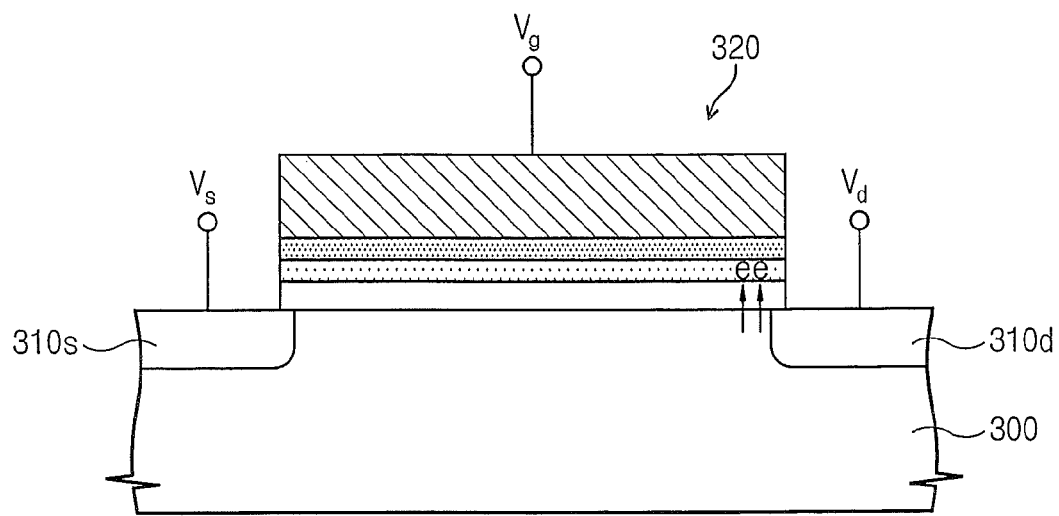

Referring to FIG. 25A, during a program operation, a positive program voltage, a ground voltage, and a positive voltage are applied to a gate electrode 320, a first diffusion region 310s, and a second diffusion region 310d, respectively. Further, a ground voltage or a negative voltage is applied to a substrate. Electrons migrating to the second diffusion region 310d from the first diffusion region 310s through a channel region formed below the gate electrode 320 are laid in a high energy state and injected into a charge storage insulation layer over a potential barrier by a vertical electric field crossing the tunnel insulation layer. The injected electrons are trapped in a trap level of the charge storage layer to form a data storage region at the charge storage insulation layer in the vicinity of the second diffusion region 310d. By exchanging voltages applied to the first and second diffusion regions 310s and 310d, electrons may also be injected into a charge storage layer in the vicinity of the first diffusion region 310s. That is, according to this embodiment, independent data storage regions are formed at the first and second diffusion regions 310s and 310d, respectively. By the electrons stored in a data storage region, a gate voltage for inverting a channel region below the data storage region is fluctuated. Namely, a threshold voltage of a mid portion of the channel region is fixed and a threshold voltage below a data storage region is fluctuated by stored charges. Thus, 1-bit data may be stored using only one of the data storage regions or 2-bit data may be stored using both the data storage regions.

Figure 25B:
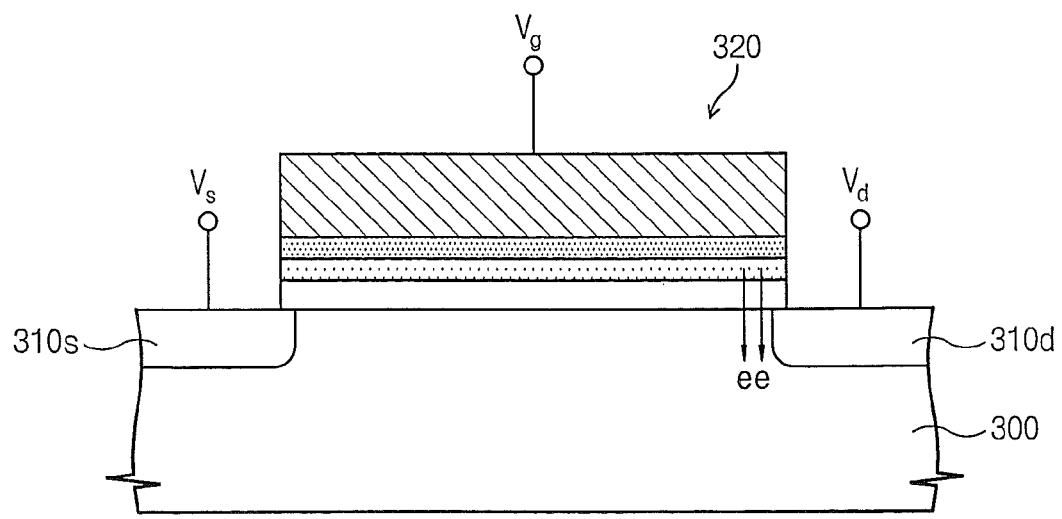

Referring to FIG. 25B, an erase operation of the memory device includes applying a negative erase voltage to a gate electrode to establish a stronger minimum field than a minimum field established at a blocking insulation layer. Thus, electrons accumulated in a charge storage insulation layer are discharged to a substrate through a tunnel insulation layer by F-N tunneling or holes are introduced into the charge storage insulation layer by F-N tunneling. In a case where 2-bit data are stored, they may be erased at the same time.

A method of selectively programming and erasing one of 2-bit data will now be described with reference to FIG. 26A and FIG. 26B.

Figure 26A:
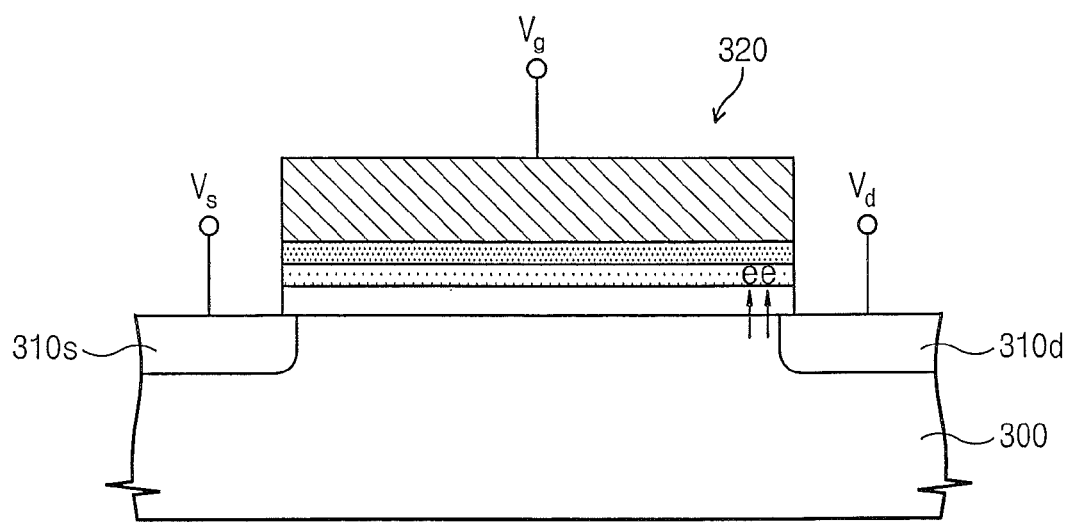

Referring to FIG. 26A, a program method of the memory device includes injecting electrons of a high energy state into a charge storage insulation layer over a potential barrier, like the program method described with reference to FIG. 25A. By exchanging voltages applied to a first diffusion region 310s and a second diffusion region 310d, data storage regions each storing 1-bit data are formed in the vicinity of the first and second diffusion regions 310s and 310d.

Figure 26B:
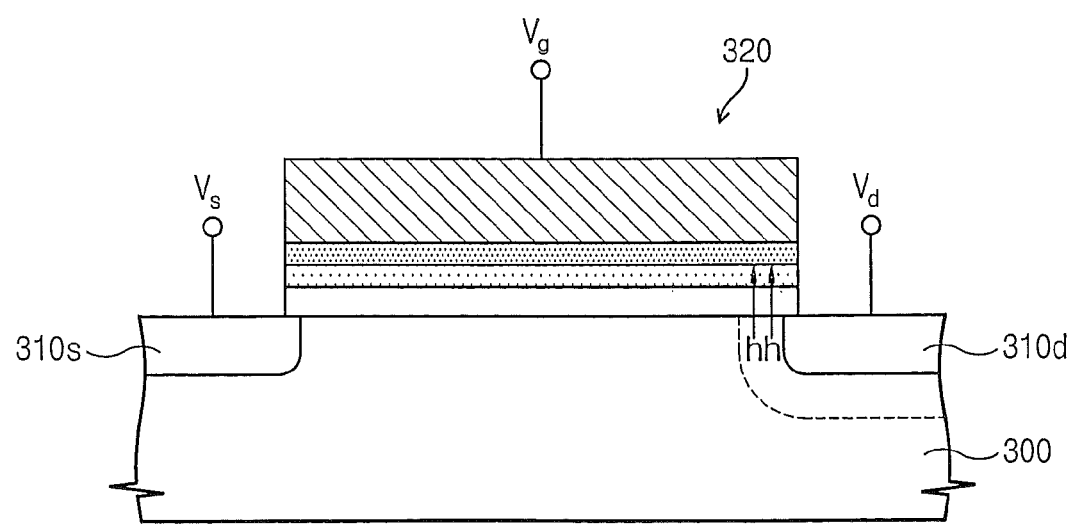

Referring to FIG. 26B, an erase operation of this embodiment is characterized by introducing holes into a charge storage insulation layer to drop a threshold voltage of a channel region below a data storage region. A positive erase voltage Vd relative to a substrate is applied to a second diffusion region 310d, and a gate electrode 320 is grounded or a negative voltage Vg is applied to the gate electrode 320. Due to a high erase voltage Vd applied to the second diffusion region 310d, hot holes are generated around a surface of a substrate adjacent to a tunnel insulation layer by band-to-band tunneling. The hot holes are introduced into a charge storage insulation layer by a vertical electric field crossing the tunnel insulation layer to erase data stored in the data storage region. At this time, the first diffusion region 310s may be grounded or floated. Similar to erasure of the data stored in the data storage region in the vicinity of the second diffusion region 310d, data stored in the data storage region in the vanity of the first diffusion region 310s may be erased by exchanging voltages applied to the first and second diffusion regions 310s and 310d.

An operating method of FIG. 26A and FIG. 26B is not limited to storage of 1 bit by 1 bit (total 2 bits) in both data storage regions and may be applied to storage of data in only one data storage region. Further, the operation method is advantageous to independently erase data stored in both data storage regions.

A method of enhancing an erase speed of programmed charges will now be described with reference to FIG. 27A and FIG. 27B.

Figure 27A:
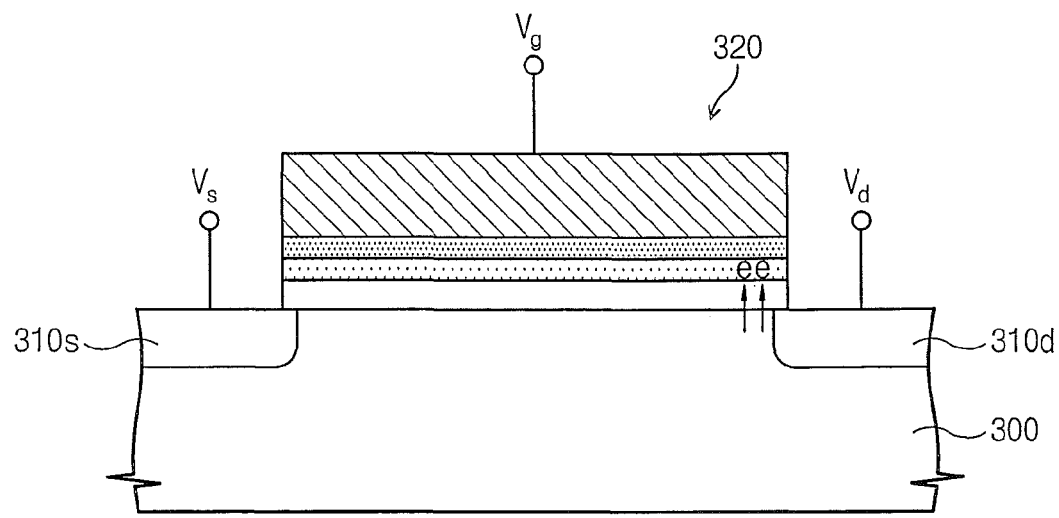

Referring to FIG. 27A, similar to described in FIG. 25A and FIG. 26A, electrons are injected into a charge storage insulation layer in the vicinity of a diffusion region to store 1-bit data in only a data storage region adjacent to one diffusion region or to store 1 bit and 1 bit (total 2 bits) in both data storage regions, respectively.

Figure 27B:
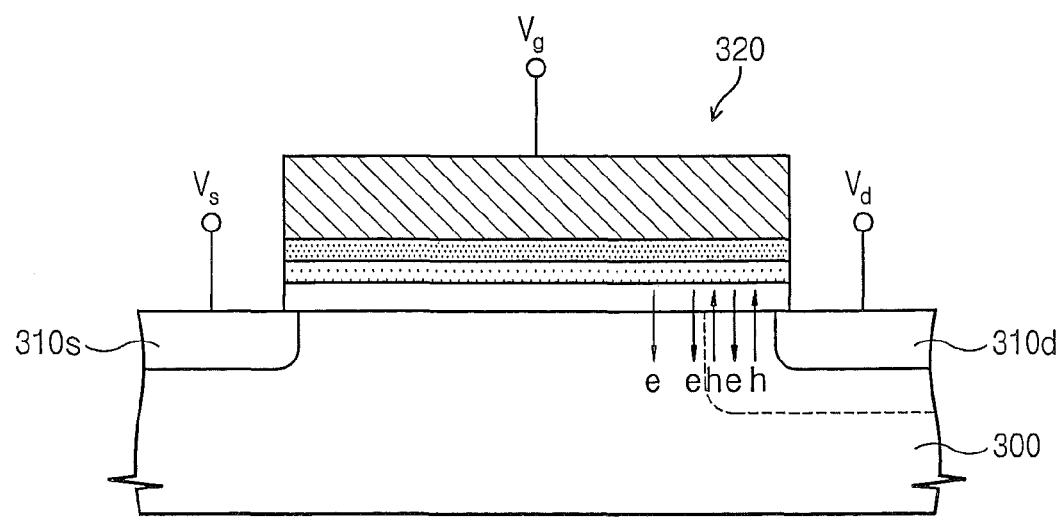

Referring to FIG. 27B, an erase operation of this embodiment is characterized by simultaneously introducing hot holes generated at a diffusion region into a charge storage insulation layer and discharging electrons stored in the charge storage insulation layer to a substrate by using F-N tunneling. A negative erase voltage relative to the substrate is applied to the substrate. Thus, electrons stored in a data storage region are discharged to the substrate through a tunnel insulation layer by using F-N tunneling. Although a minimum field established at a tunnel insulation layer is weaker than a minimum field established at a blocking insulation layer, drop of a threshold voltage may be limited because there is the tunneling probability of charges through the blocking insulation layer. However, in this embodiment, the threshold voltage drop limitation may be overcome by erasing stored electrons using F-N tunneling and introducing hot holes into a charge storage insulation layer at a substrate in the vicinity of a diffusion region.

Specifically, a negative erase voltage is applied to a gate electrode 320 and a first diffusion region 310s and a second diffusion region 310d are floated to tunnel holes to a charge storage insulation layer from a substrate and to tunnel electrons to a substrate to the charge storage insulation layer. Simultaneously or alternately, similar to described in FIG. 17B, a gate electrode is grounded or a negative voltage is applied to the gate electrode and a positive erase voltage is applied to a diffusion region in the vicinity of a storage region of data to be erased. Thus, holes are introduced into the charge storage insulation layer. In a case where electrons are stored in both data storage regions, an erase voltage is applied to both the first diffusion region 310s and the second diffusion region 310d.

In the above-described embodiment, a program operation is to introduce electrons into a charge storage insulation layer or erasing holes, and an erase operation is to discharge electrons from a charge storage insulation layer or introduce holes into the charge storage insulation layer. To the contrary, a program operation may be to introduce holes a charge storage insulation layer or discharge electrons from the charge storage insulation layer, and an erase operation may be to inject electrons into a charge storage insulation layer or discharge holes from the charge storage insulation layer.

In this embodiment, an erase operation is performed, for example, by applying a voltage of −9 volts to a gate electrode, applying a voltage of 0 volt to a diffusion region in the vicinity of a storage region of data to be erased, and floating a diffusion region in the vicinity of a storage region of data not to be erased. Thus, data may be erased using F-N tunneling and hot hole introduction at the same time.

In a non-volatile memory device according to some embodiments of the present invention, a minimum field established at a tunnel insulation layer is weaker than a minimum field established at a blocking insulation layer. For this reason, the tunneling probability of charges through the tunnel insulation layer is higher than that of charges through the blocking insulation layer when a voltage is applied to a gate electrode and a substrate to make a voltage level difference therebetween. Accordingly, there is a large difference between threshold values of a program threshold voltage and an erase threshold voltage. Further, a program speed and an erase speed may be enhanced, and program and erase voltages may drop. In a case where charges migrate through a tunneling insulation layer using hot charge injection of a high energy state, even a lower electric field than an electric field required for tunneling the charges through a blocking insulation layer is sufficient for migration of the charges. Therefore, the above disadvantages may be enhanced.

Figure 28:
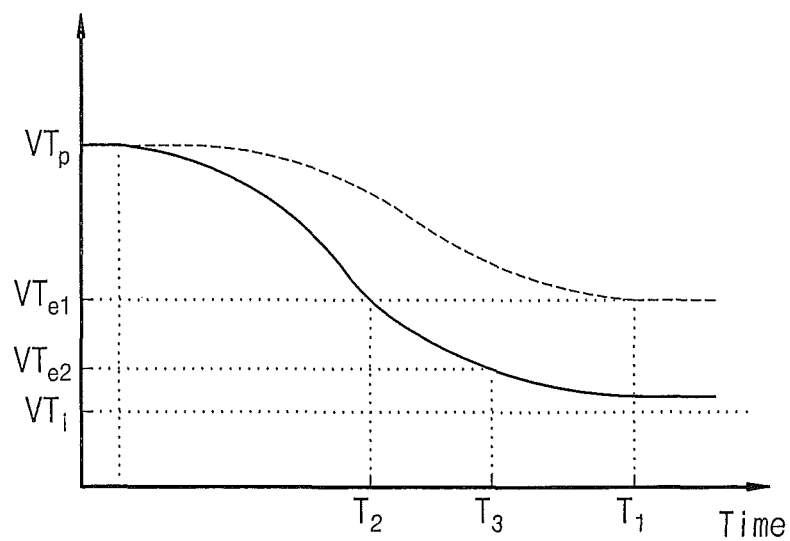
FIG. 28 shows a graph that illustrates fluctuation of a threshold voltage of a non-volatile memory device according to some embodiments of the present invention.

FIG. 28 is a graph of a threshold voltage fluctuation with erase time of a non-volatile memory device. In the graph, a solid line represents a threshold voltage fluctuation of a non-volatile memory device according to some embodiments of the present invention and a dotted line represents a threshold voltage fluctuation of a convention non-volatile memory device.

Referring to FIG. 28, after fabrication of a non-volatile memory device is completed, strong non-polarity energy such as ultraviolet (UV) is irradiated to remove charges existing in a charge storage insulation layer. This is called an initial state in which a gate voltage to invert a channel region is an initial threshold voltage $VT_i$. If electrons are stored in a charge storage insulation layer due to a program operation, the non-volatile memory device enters a program state in which a gate voltage to invert a channel region is a program threshold voltage VTp. If the electrons stored in the charge storage insulation layer of the program state are removed or introduced holes counterbalances the stored electrons due to an erase operation, the non-volatile memory device enters an erase state in which a gate voltage to invert a channel region is an erase threshold voltage $TT_{en}$. As illustrated, a conventional non-volatile memory device takes time T1 required for reaching an erase threshold voltage $VT_{e1}$, while a non-volatile memory device according to some embodiments of the invention takes time T2 required for reaching an erase threshold voltage $VT_{e1}$. That is, an erase speed of the non-volatile memory device according to embodiments of the invention is higher than that of the conventional non-volatile memory device. Further, if a point where a threshold voltage fluctuation with erase time is rapidly reduced is defined as a critical value, a critical value of the non-volatile memory device according to embodiments of the invention is smaller than that of the conventional non-volatile memory device although they start with the same program threshold voltage $VT_p$. Thus, a lower voltage $VT_{e2}$ than the erase threshold voltage $VT_{e1}$ of the conventional non-volatile memory device may be defined as an erase threshold voltage to increase a difference between a program threshold voltage and an erase threshold voltage.

Fluctuation of a gate voltage to invert a channel region means that a voltage state is fluctuated by charges stored in a charge storage insulation layer. Accordingly, a number of discontinuous voltage states are defined between a voltage state corresponding to a threshold value of a program threshold voltage and a threshold value of an erase threshold voltage to assign data bits to respective voltage states.

Figure 29:
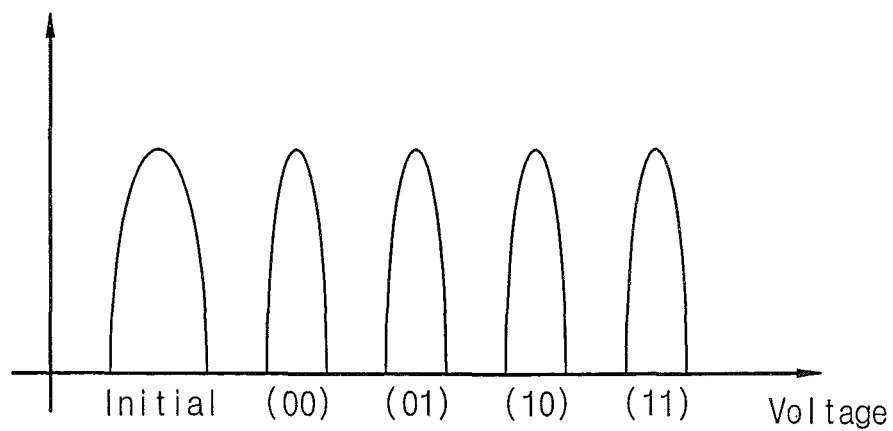
FIG. 29 shows a graph of a threshold voltage based on data bits of a non-volatile memory device according to some embodiments of the present invention.

FIG. 29 is a graph of data bits based on threshold voltages when the data bits are assigned to respective a number of discontinuous voltage states. Referring to FIG. 20, a number of discontinuous threshold voltage states are defined while a threshold voltage of an initial state, i.e., an initial threshold voltage rises. According to the rise order of an initial threshold voltage by unit voltage, data "00", "01", "10", and "11" are assigned thereto to store 2 bits in each data storage region. Embodiments of the present invention may provide a multi-valued non-volatile memory device in which 2 bits are stored in each data storage region according to a threshold voltage to store 2 bits in respective data storage regions disposed in the vicinity of a diffusion region adjacent to opposite sides of a channel region, i.e., 4 bits are stored in a memory cell.

As previously described with reference to FIG. 25A through FIG. 27A and FIG. 25B through FIG. 27B, one of diffusion regions adjacent to opposite sides of a channel region is selected and a data region is formed at a charge storage region in the vicinity of the selected diffusion region to store data using program and erase operations. Since a voltage state of a charge storage insulation layer fluctuates a threshold voltage to invert an underlying channel region, a predetermined read voltage is applied to a gate electrode to read a data value depending upon whether the channel region is inverted.

Figure 30A:
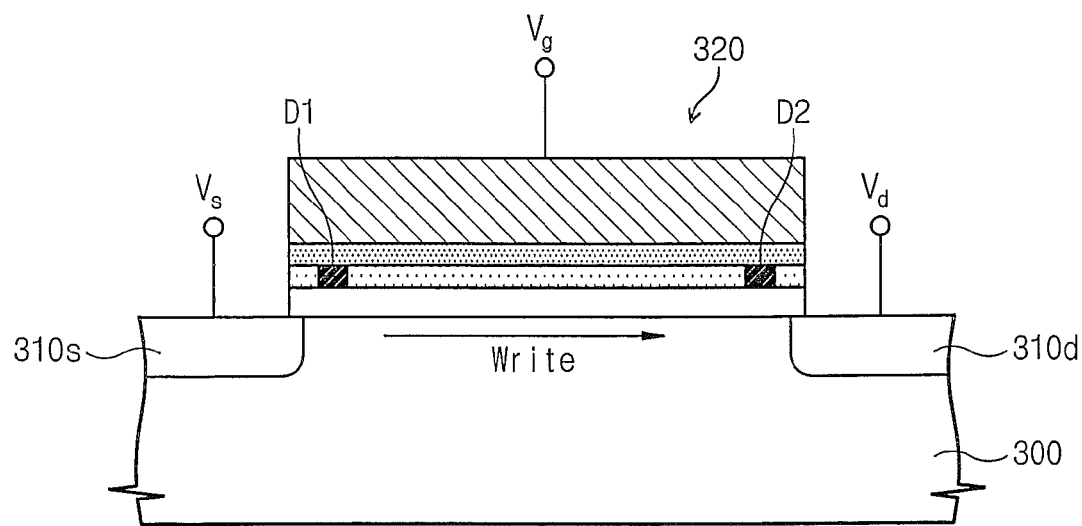
FIG. 30A and FIG. 30B are diagrams that illustrate methods of reading a non-volatile memory device according to some embodiments of the present invention.

A method of reading a non-volatile memory device according to some embodiments of the invention will now be described with reference to FIG. 30A and FIG. 30B. Referring to FIG. 30A, a positive gate voltage is applied to a gate electrode 320, a ground voltage is applied to a first diffusion region 310s, and a positive read voltage is applied to a second diffusion region 310d to read data stored in a data storage region D2 in the vicinity of the second diffusion region 310d. At this time, a read voltage is a voltage between a threshold voltage of a state where electrons are stored in the data storage region D2, i.e., a write threshold voltage and a threshold voltage of a state where electrons are removed from the data storage region D2, i.e., an erase threshold voltage. Therefore, data stored in a non-volatile memory device may be judged depending upon whether a channel below the data storage region D2 is inverted when a read voltage is applied. Although a voltage is applied to a diffusion region, a depletion layer of the diffusion region does not extend to a portion below the data storage region D2.

In a read method described with reference to FIG. 30A, a high voltage is applied to a diffusion region in the vicinity of a data storage region D to measure current flowing through a channel region. Thus, data is read out. If a length of a channel below the data storage region D is shortened, electrons transferred by a horizontal electric field pass a short channel region and thus current may flow. In a case where data are stored in data storage regions adjacent to opposite sides of a channel region, the read method may be restrictively applied to a multi-valued non-volatile memory device having a number of data storage regions because inversion of a channel region affects another data storage region.

Figure 30B:
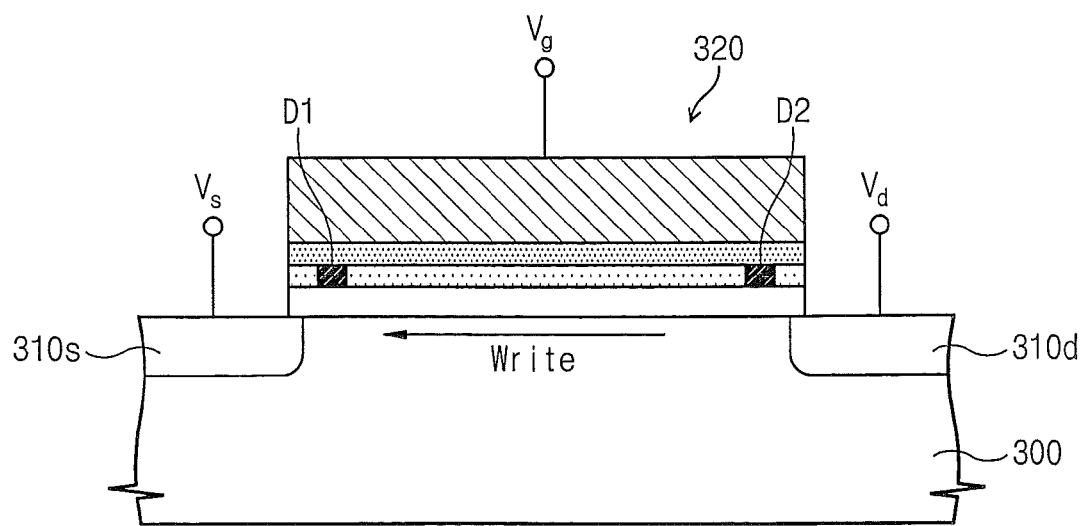

FIG. 30B is a diagram of another a read method to prevent current from flowing through a channel region although a channel length is short and to store data in both data storage regions. Thus, this read method may be applied to multi-valued non-volatile memory devices.

Referring to FIG. 30B, a positive read voltage Vg is applied to a gate electrode 300, and a positive voltage relative to the gate electrode 300 is applied to a first diffusion region and a negative voltage relative to the gate electrode 300 is applied to a second diffusion region 310d to read data stored in a data storage region D2 in the vicinity of the second diffusion region 310d. The read voltage has an intermediate value between a program threshold voltage and an erase threshold voltage. Due to a voltage applied to the first diffusion region 310s, a depletion layer of a junction surface between the first diffusion region 310s and a substrate 300 extends to a data storage region D1 in the vicinity of the first diffusion region 310s. Thus, the data storage region D1 does not affect inversion of a channel region. At a channel region below the data storage region D2 storing data to be read out, it is possible to prevent electrons from migrating to the first diffusion region 310s through the channel region. In this regard, voltages applied to the first and second diffusion regions 310s and 310d are exchanged to read data stored in the data storage regions D1 and D2 adjacent to opposite sides of the channel region. In a case where 2-bit data is stored in one data storage region, a gate voltage between threshold voltage levels each corresponding to the 2 bits is applied to read data.

Upon all program procedures of a non-volatile memory device according to some embodiments of the present invention, a program threshold voltage may be regulated by iteratively performing program and verify operations. That is, charges are injected into a charge storage insulation layer using a program voltage for a defined unit time and a threshold voltage is measured. If the threshold voltage does not reach a program threshold voltage, a program voltage increasing by unit voltage is applied to inject charges and a threshold voltage is measured. If the threshold voltage reaches a desired program threshold voltage by iteratively injecting the charges and measuring the threshold voltage, the program operation is stopped. In a program operation as well as an erase operation, erase and verify cycles are repeated to enable a threshold voltage to reach a desired erase threshold voltage. A threshold voltage may be verified depending on whether a channel region is inverted, when a verify voltage for verifying a threshold voltage is applied to a gate electrode.

According to some embodiments of the present invention, a minimum field established at a tunnel insulation layer is weaker than a minimum field established at a blocking insulation layer. Therefore, it can be possible to increase the amount of charges migrating through the tunnel insulation layer and decrease the amount of charges migrating through the blocking insulation layer. As a result, a non-volatile memory device formed thereby may provide one or more of the following advantages: a greater difference between a threshold voltage of a program threshold voltage and a threshold value of an erase threshold voltage, shorter program and write times, and superior data retention characteristic. Due to the greater difference between the threshold values of the program threshold voltage and the erase threshold voltage, a plurality of threshold voltages are defined therebetween and data bits are assigned to the respective threshold voltages to fabricate a multi-valued non-volatile memory device.

While the present invention has been particularly shown and described with respect to exemplary embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A non-volatile memory device comprising:
   an active region;
   a gate electrode on the active region;
   a charge storage insulation layer between the gate electrode and the active region;
   a multiple tunnel insulation layer comprising a plurality of layers between the active region and the charge storage insulation layer; and
   a multiple blocking insulation layer comprising a plurality of layers between the charge storage insulation layer and the gate electrode,
   wherein the plurality of layers of the multiple blocking insulation layer comprise a first insulation layer having a first dielectric constant that is highest among dielectric constants of the plurality of layers of the multiple blocking insulation layer, the plurality of layers of the multiple tunnel insulation layer comprise a second insulation layer having a second dielectric constant that is highest among dielectric constants of the plurality of layers of the multiple tunnel insulation layer, and the first dielectric constant of the first insulation layer is greater than the second dielectric constant of the second insulation layer,
   wherein the multiple blocking insulation layer comprises a silicon oxide layer, and
   wherein the charge storage insulation layer and the multiple blocking insulation layer comprise a high-k dielectric layer that comprises hafnium and has a dielectric constant higher than a dielectric constant of silicon dioxide, and the high-k dielectric layer comprises a portion having a hafnium concentration that gradually decreases along a direction from the multiple tunnel insulation layer to the gate electrode.

2. The non-volatile memory device of claim 1, wherein a portion of the gate electrode contacting the multiple blocking insulation layer has a work function greater than 4.0 eV.

3. The non-volatile memory device of claim 2, wherein the multiple tunnel insulation layer further comprises at least one insulation layer comprising $Al_2O_3$, hafnium aluminate, and/or hafnium silicate.

4. The non-volatile memory device of claim 2, wherein the first insulation layer of the multiple blocking insulation layer is thicker than the second insulation layer of the multiple tunnel insulation layer.

5. A method of operating the non-volatile memory device of claim 1, wherein a voltage is applied between the gate electrode and the active region to form a voltage level difference therebetween sufficient to establish a minimum field in the multiple tunnel insulation layer that is stronger than a minimum field established in the multiple blocking insulation layer so as to store charges in the charge storage insulation layer or remove stored charges from the charge storage insulation layer.

6. The method of claim 5, wherein the non-volatile memory device further comprises a first region and a second region in the active region adjacent to respective opposing sides of the gate electrode, and wherein the method further comprises programming the non-volatile memory device by applying a positive program voltage to the gate electrode to invert a channel region, applying a ground voltage to one of the first and second regions and applying a positive voltage to the other one of the first and second regions sufficient to cause injection of electrons into the charge storage insulation layer through the multiple tunnel insulation layer.

7. The method of claim 6, further comprising reversing the voltages applied to the first and second regions to cause injection of electrons into an electron-deficient portion of the charge storage insulation layer adjacent to the first and second regions.

8. The method of claim 6, further comprising:

erasing the non-volatile memory device by applying a negative erase voltage to the gate electrode and floating the first and second regions to discharge the electrons stored in the charge storage insulation layer to the channel region through the multiple tunnel insulation layer or introducing holes into the charge storage insulation layer.

9. The method of claim 6, further comprising:

erasing the non-volatile memory device by applying a positive erase voltage to the one of the first and second regions adjacent to an electron-storing portion of the charge storage insulation layer, floating the other one of the first and second regions adjacent to an electron-deficient portion of the charge storage insulation layer so as to introduce hot holes into the charge storage insulation layer through the multiple tunnel insulation layer from a depletion layer of the one of the first and second regions to which the positive erase voltage is applied.

10. The method of claim 6, further comprising:

erasing the non-volatile memory device by applying a negative erase voltage to the gate electrode, applying a positive erase voltage to the one of the first and second regions adjacent to an electron-storing portion of the charge storage insulation layer, and floating the other one of the first and second regions adjacent to an electron-deficient portion of the charge storage insulation layer so as to introduce hot holes into the charge storage insulation layer through the multiple tunnel insulation layer from a depletion layer of the one of the first and second regions to which the positive erase voltage is applied and, simultaneously, discharging the electrons stored in the charge storage insulation layer to the channel region through the multiple tunnel insulation layer.

11. The method of claim 6, further comprising:

(a) applying a negative erase voltage to the gate electrode and floating the first and second regions to discharge the electrons stored in the charge storage insulation layer to the channel region through the multiple tunnel insulation layer; and (b) applying a positive erase voltage to the one of the first and second regions adjacent to an electron-storing portion of the charge storage insulation layer and floating the other one of the first and second regions adjacent to an electron-deficient portion of the charge storage insulation layer to introduce hot holes into the charge storage insulation layer through the multiple tunnel insulation layer from a depletion layer of the one of the first and second regions to which the positive erase voltage is applied, wherein the methods of (a) and (b) are alternately and repetitively performed.

12. The method of claim 6, further comprising:

reading the non-volatile memory device by applying a positive read voltage to the gate electrode, and applying a ground voltage relative to the gate electrode to the one of the first and second regions and applying a positive voltage to the other one of the first and second regions to determine whether there are a sufficient level of charges stored in the charge storage insulation layer in a vicinity of the one of the first and second regions to which the ground voltage is applied.

13. The non-volatile memory device of claim 1, wherein the high-k dielectric layer of the charge storage insulation layer and the multiple blocking insulation layer comprises hafnium aluminate and/or hafnium silicate.

14. The non-volatile memory device of claim 1, wherein a portion of the charge storage insulation layer adjacent the multiple tunnel insulation layer has a constant hafnium concentration.

15. The non-volatile memory device of claim 1, wherein the multiple tunnel insulation layer comprises a silicon oxide layer and an insulation layer that has a dielectric constant higher than a dielectric constant of the silicon oxide layer of the multiple tunnel insulation layer.

16. The non-volatile memory device of claim 1, wherein the multiple tunnel insulation layer comprises at least two insulation layers that are stacked on each other, and each of the at least two insulation layers comprises a silicon oxide layer, a silicon nitride layer, or a silicon oxynitride layer.

17. The non-volatile memory device of claim 1, wherein the gate electrode comprises a metal nitride layer including at least one of TiN, TaN, TaSiN, or WN, and a metal layer including tungsten (W), and wherein the metal nitride layer and the metal layer are sequentially stacked on the multiple blocking insulation layer.

* * * * *